United States Patent
Inaba et al.

(12)

(10) Patent No.: US 6,288,927 B1
(45) Date of Patent: Sep. 11, 2001

(54) SEMICONDUCTOR MEMORY DEVICE WITH COLUMN GATE AND EQUALIZER CIRCUITRY

(75) Inventors: Tsuneo Inaba; Shinichiro Shiratake, both of Yokohama; Kouji Tsuchida, Kawasaki, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/587,263

(22) Filed: Jun. 5, 2000

Related U.S. Application Data

(63) Continuation of application No. 09/072,724, filed on May 6, 1998, now Pat. No. 6,094,390.

(30) Foreign Application Priority Data

May 9, 1997 (JP) .................................................... 9-119639

(51) Int. Cl.[7] .................................................... G11C 5/06
(52) U.S. Cl. .......................... 365/63; 365/149; 257/296; 257/369
(58) Field of Search ............................. 365/63, 149, 129; 257/369, 296, 401

(56) References Cited

U.S. PATENT DOCUMENTS

| 4,853,897 | 8/1989 | Nogami et al. .................. 365/189.11 |
| 5,416,350 | * 5/1995 | Watamabe .............................. 257/330 |
| 5,528,542 | 6/1996 | Okamura .............................. 365/205 |
| 5,579,256 | 11/1996 | Kajigaya et al. ........................ 365/51 |
| 5,973,369 | * 10/1999 | Hayashi ................................ 257/369 |

FOREIGN PATENT DOCUMENTS 7-135257   5/1995   (JP) .

* cited by examiner

*Primary Examiner*—Hoai V. Ho
(74) *Attorney, Agent, or Firm*—Banner & Witcoff, Ltd.

(57) ABSTRACT

A semiconductor memory device includes a semiconductor substrate and a plurality of element regions formed in the semiconductor, wherein at least one column gate and at least one equalizer are formed as a set in one element region of the plurality of element regions. In one embodiment, a set of a column gate and an equalizer share a diffusion layer with an adjacent set of a column gate and an equalizer. In a second embodiment, a gate electrode of the equalizer is disposed to divide a diffusion layer into six regions. In other embodiments, the equalizer is surrounded by at least a gate electrode of a column gate. In yet other embodiments, the sets of column gates and equalizers are disposed parallel to a bit line.

77 Claims, 40 Drawing Sheets

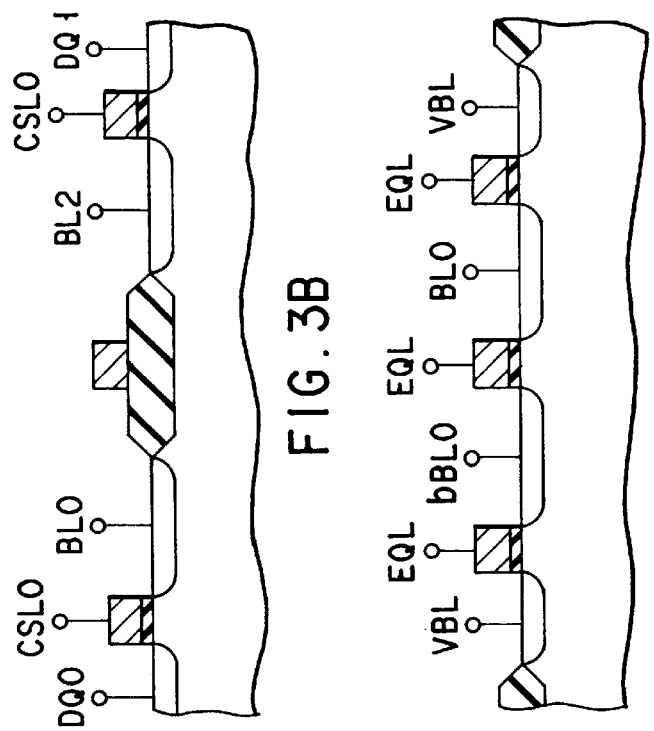
FIG. 3B
FIG. 3C
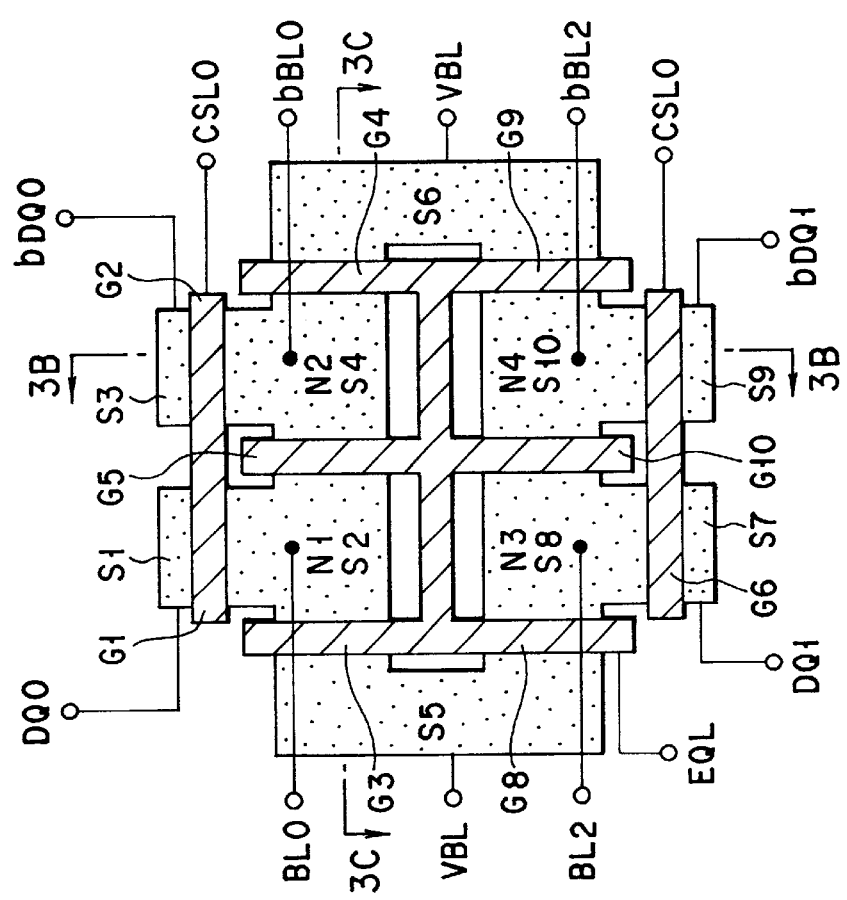
FIG. 3A (LAYER #0, LAYER #1, ⊠:CONT-02, ⊞:CONT-12)

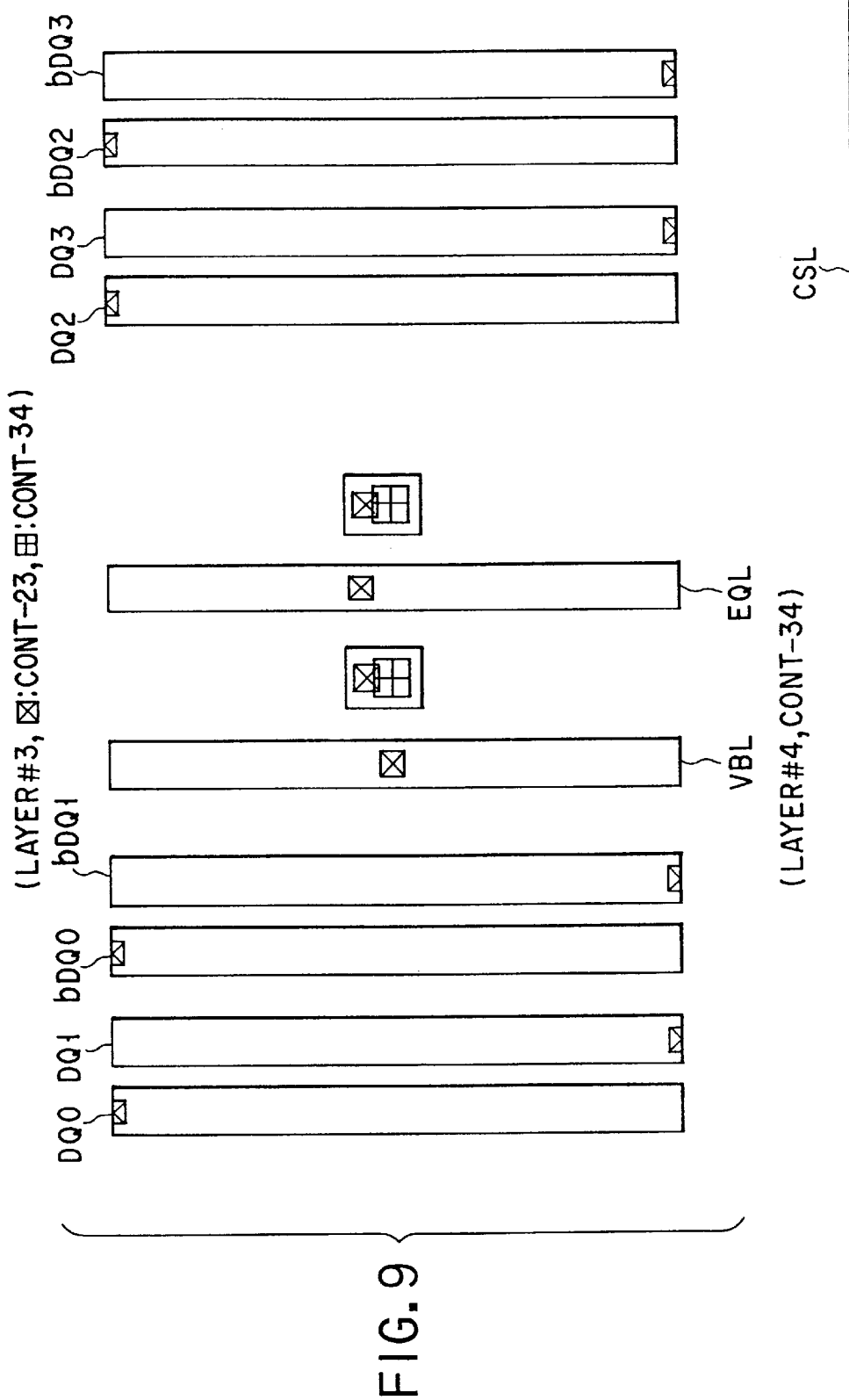

(LAYER#0, LAYER#1, ⊠:CONT-02, ⊞:CONT-12)

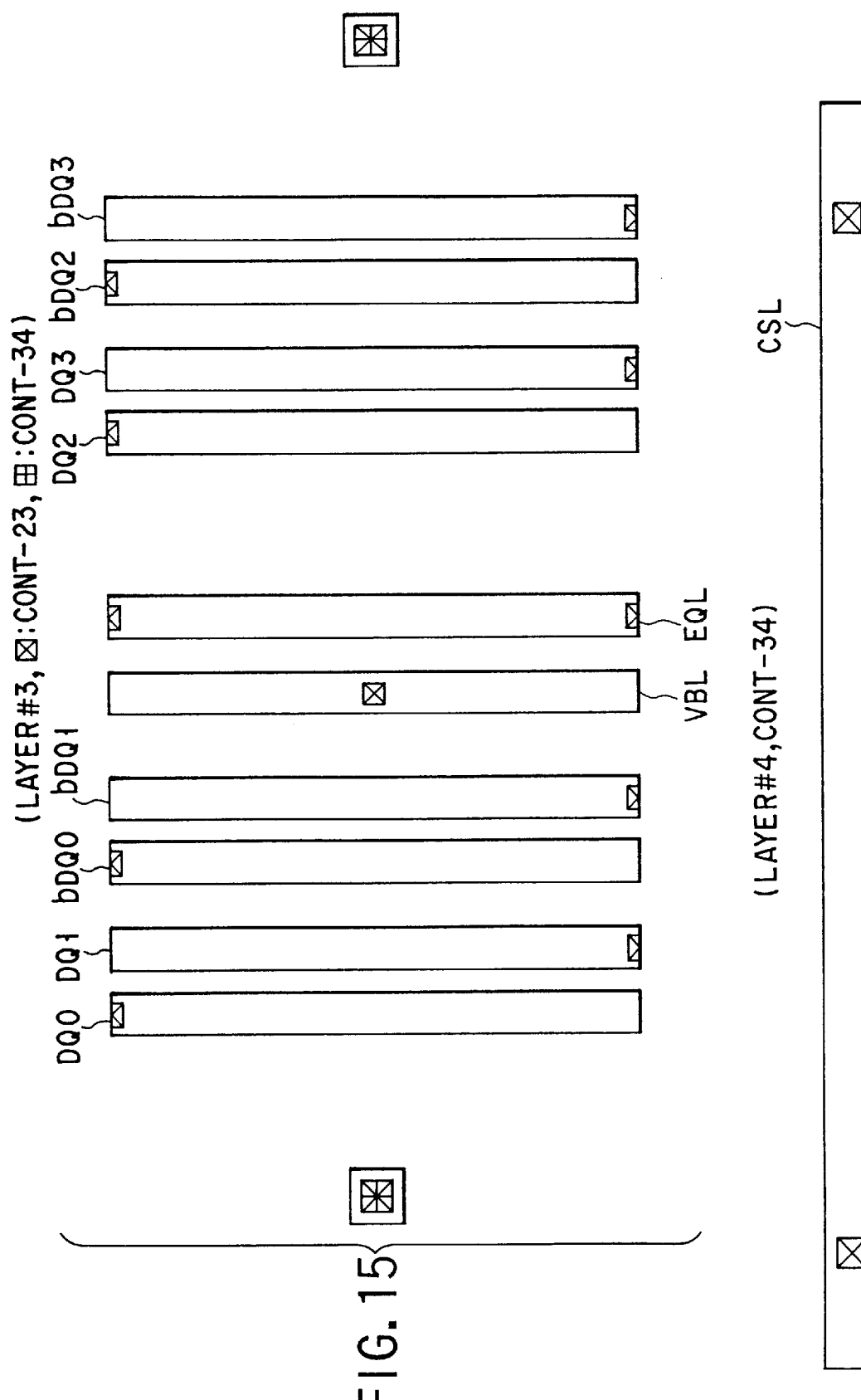

(LAYER#0, LAYER#1, ⊠:CONT-02, ⊞:CONT-12)

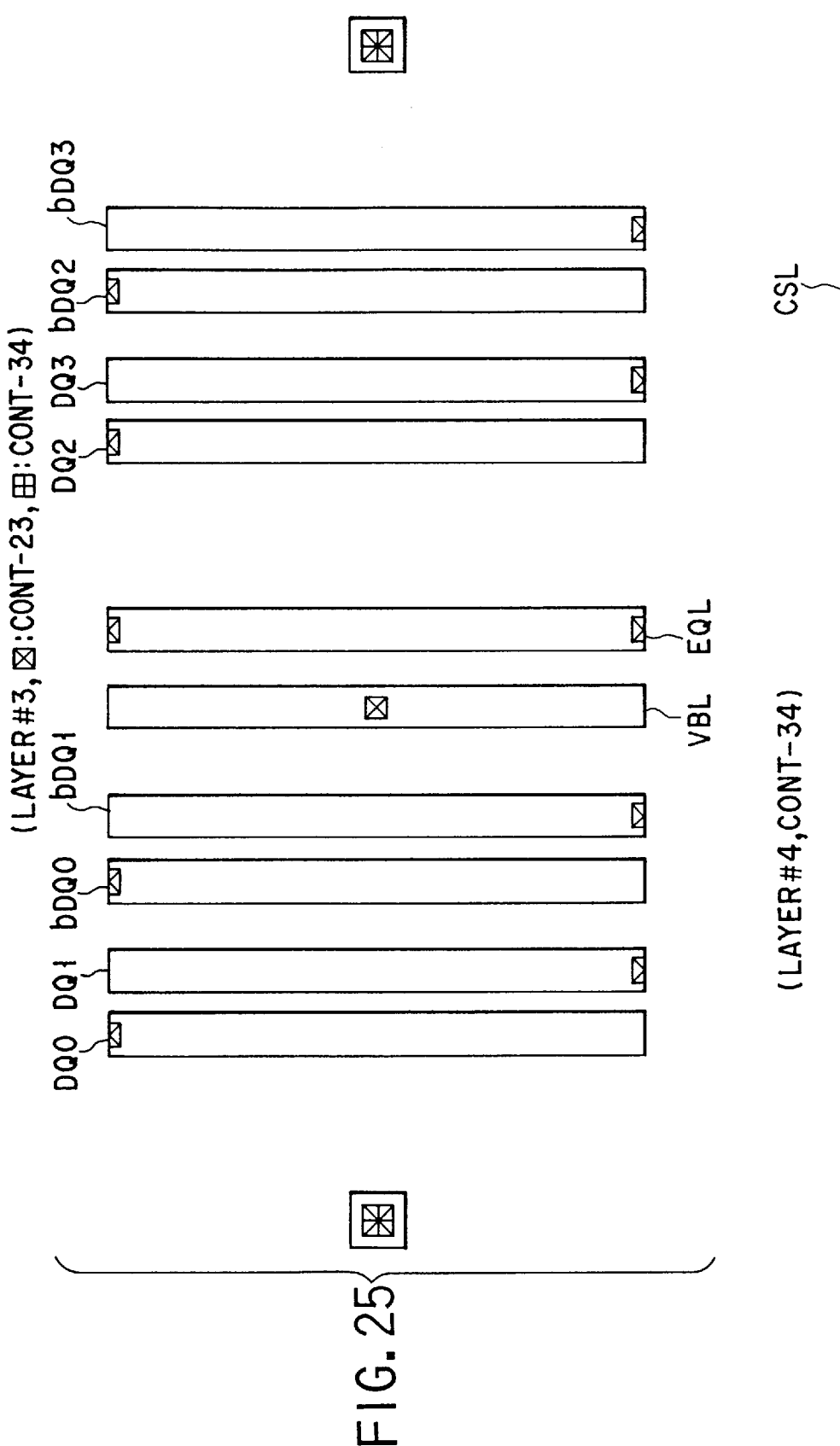

(LAYER #0, LAYER #1, ⊠:CONT-02, ⊞:CONT-12)

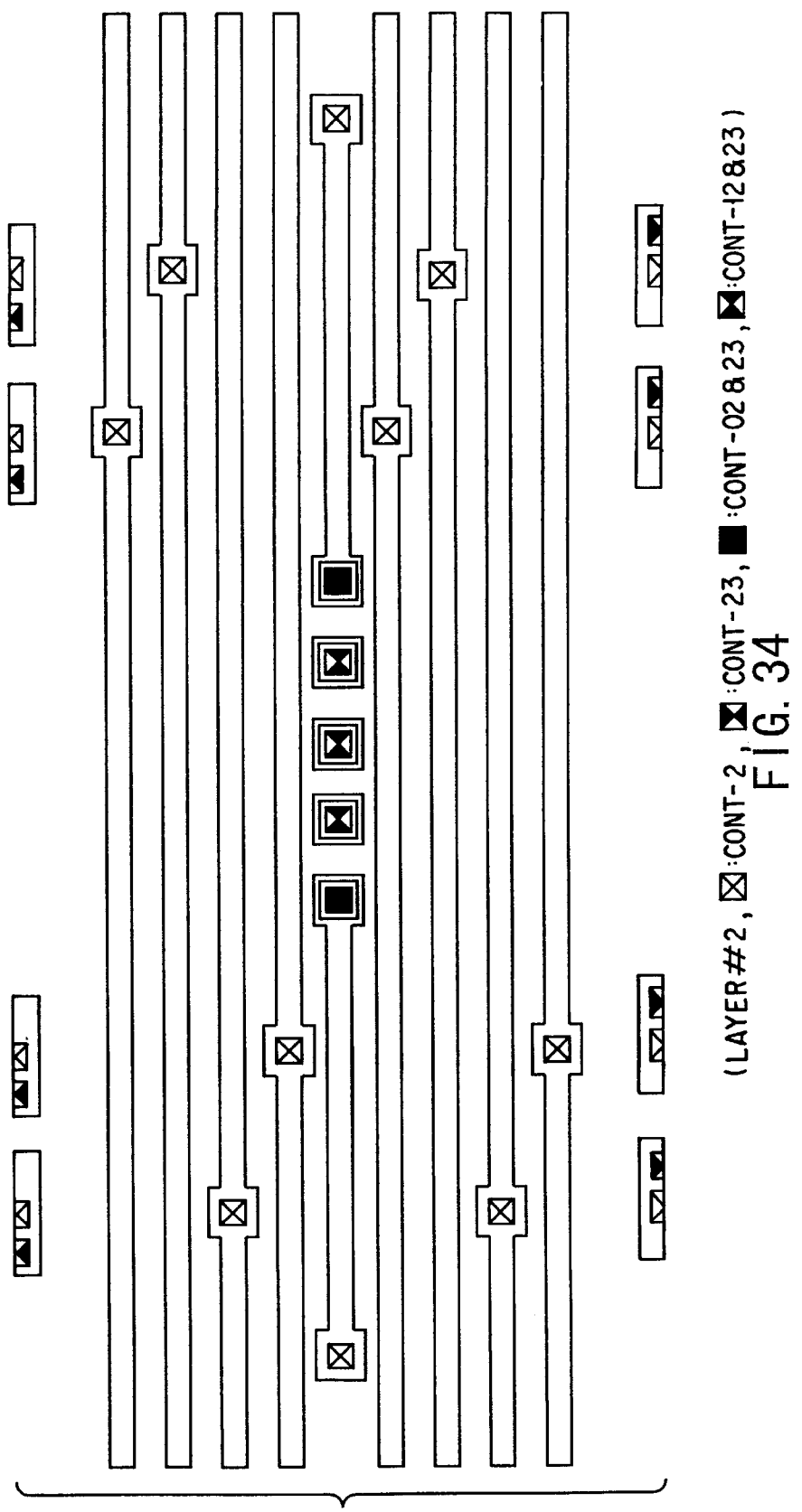

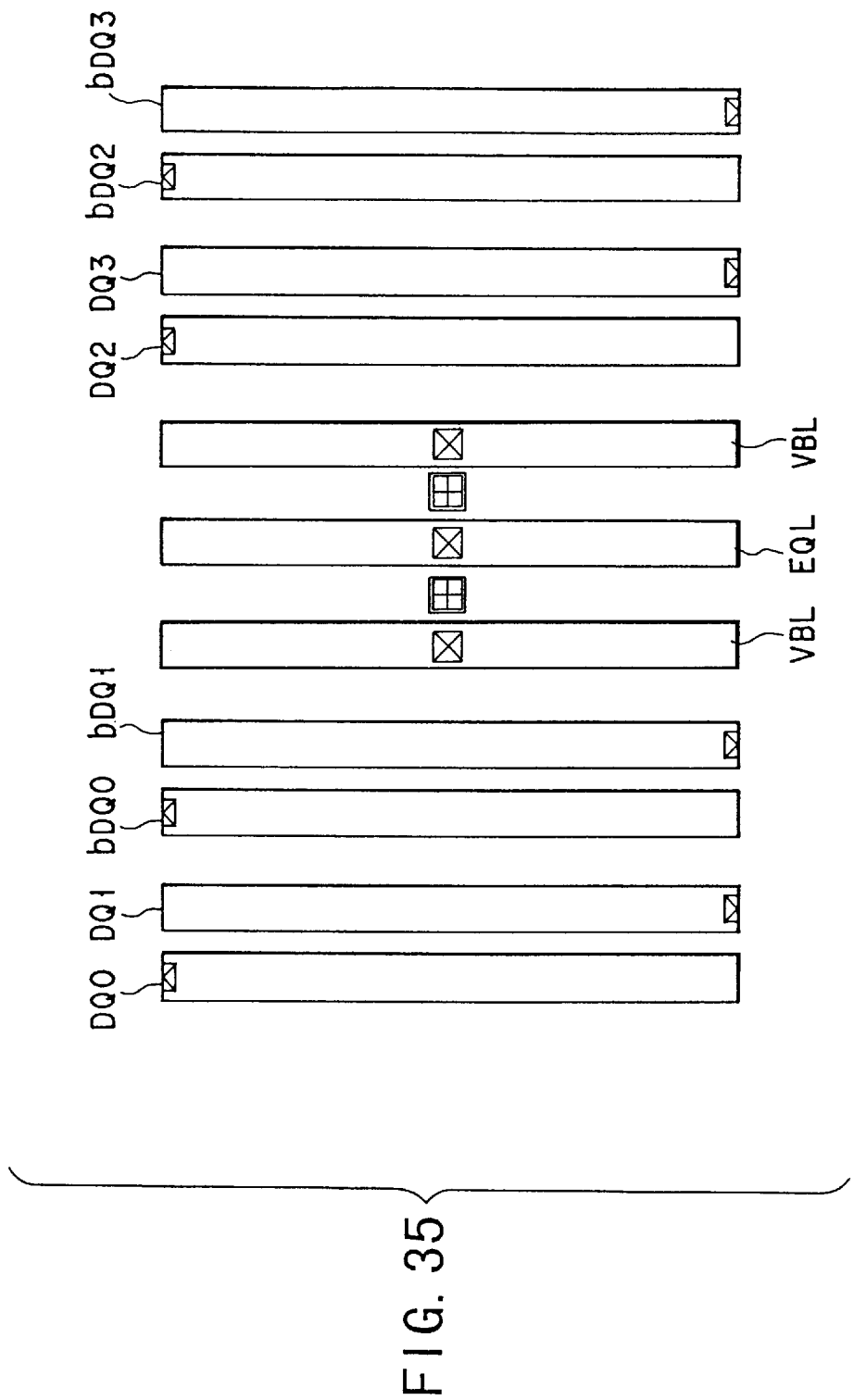

(LAYER#2, ⊠ CONT-02, ⊠ CONT-23, ■ CONT-02&23, ⊠ CONT-12&23)

FIG. 41 (LAYER #4)

(LAYER#0, LAYER#1, ⊠ :CONT-02 , ⊞ :CONT-12 )

(LAYER#3, ⊠:CONT-02, ⊠:CONT-23, ■:CONT-02 & 23, ⊠:CONT-12 & 23)

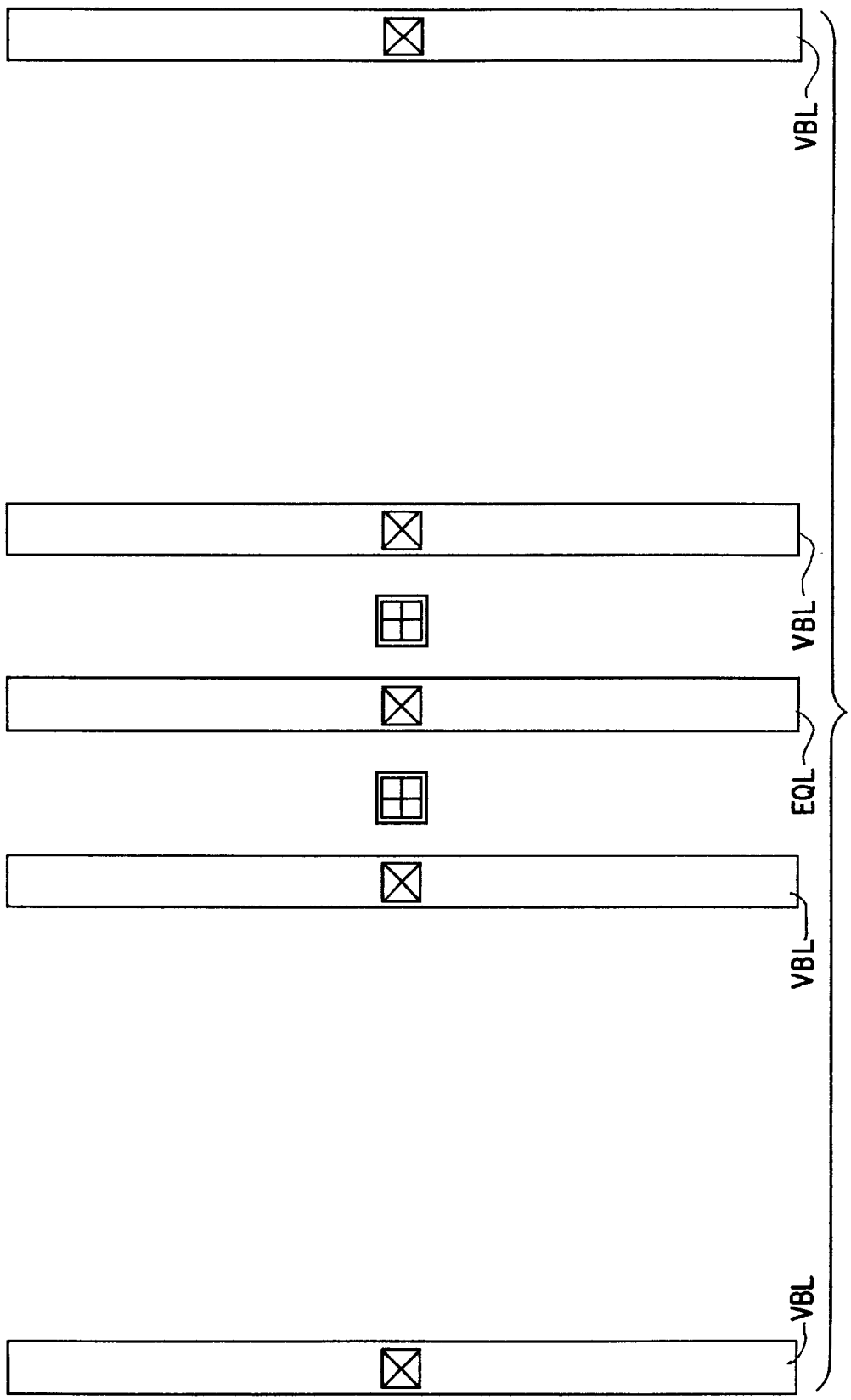

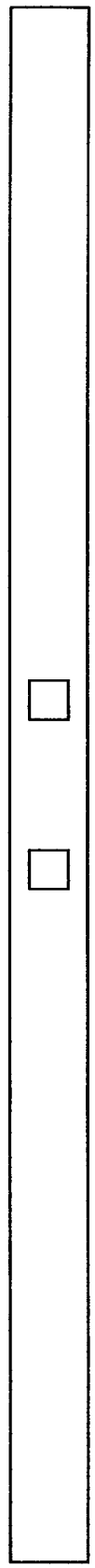
FIG. 46 (LAYER#4)

SEMICONDUCTOR MEMORY DEVICE WITH COLUMN GATE AND EQUALIZER CIRCUITRY

This application is a Continuation of U.S. application Ser. No. 09/072,724, filed on May 6, 1998, now U.S. Pat. No. 6,094,390.

BACKGROUND OF THE INVENTION

The present invention relates to a semiconductor memory device, more particularly to an improvement in a sense amplifier of a DRAM.

In company with a recent increase in an operating speed of a microprocessor, a high speed semiconductor memory has been demanded. The advent of a large capacity semiconductor memory and popularization of a portable gadget has further necessitated low power consumption to be realized. It is effective to reduce a bitline capacitance in order to materialize a higher speed device with lower power consumption and various techniques for the purpose have conventionally been contrived.

As main factors constituting a bitline capacitance, there are named: a bitline capacitance with other wirings (including an adjacent bitline) and a diffusion capacitance in a contact portion of a bitline with a diffusion region (hereinafter referred to as bitline contact). The bitline contact is in a broad sense divided into a contact to a diffusion region of a memory cell transistor and contacts in. a transfer gate, a bitline equalizer, a column gate and a sense amplifier, which constitute a sense amplifier section. Since each of circuits constituting the sense amplifier section has conventionally been constructed by an independent element pattern, a bitline contact has been required to be provided for each circuit.

As described above, since a bitline contact has conventionally provided for each circuit constituting the sense amplifier section, it has been difficult to reduce a bitline capacitance and it is, therefore, hard to realized a device with a high speed and low power consumption.

BRIEF SUMMARY OF THE INVENTION

It is an object of the present invention to provide a semiconductor memory device in which the number of bitline contacts in a sense amplifier section is reduced to decrease a bitline capacitance and thereby low power consumption and a high speed operation are realized.

A semiconductor memory device according to the present invention comprises: a semiconductor substrate; and a plurality of element regions formed in the semiconductor, wherein at least one column gate and at least one equalizer are formed as a set in one element region of the plurality of element regions.

Preferred embodiments of the present invention are as follows:

(1) At least two sets of the column gate and the equalizer are formed in one element region and a set of the column gate and the equalizer shares a diffusion layer with an adjacent set of the column gate and the equalizer.

(2) A gate electrode of the equalizer is disposed so as to divide a diffusion layer region into six regions.

(3) Circuit constitution is mainly considered, the column gate comprises: a first transistor, a gate of the first transistor being connected to a column gate select line, one of a source and a drain of the first transistor being connected to a first data line and the other being connected to a first bitline; and a second transistor, a gate of the second transistor being connected to the column gate select line, one of a source and a drain of the second transistor being connected to a second data line and the other being connected to a second bitline, and the equalizer comprises: a third transistor a gate of the third transistor being connected to an equalizer control line one of a source and a drain of the third transistor being connected to the first bitline and the other being connected to an equalizer voltage supply line; a fourth transistor, a gate of the fourth transistor being connected to the equalizer control line, one of a source and a drain of the fourth transistor being connected to the second bitline and the other being connected to the equalizer voltage supply line; and a fifth transistor, a gate of the fifth transistor being connected to the equalizer control line, one of a source and a drain of the fifth transistor being connected to the first bitline and the other being connected to the second bitline, wherein the other of a source and drain of the first transistor, one of a source and drain of the third transistor and one of a source and drain of the fifth transistor are connected to the first bitline through a common contact and the other of a source and drain of the second transistor, one of a source and drain of the fourth transistor and the other of a source and drain of the fifth transistor are connected to the second bitline through a common contact.

(4) Configuration of transistor is mainly considered, the column gate comprises first and second column gates; the equalizer comprises first and second equalizers; the first column gate comprises first and second transistors; the first equalizer comprises: a third transistor having a first common node in common owned by the first transistor; a fourth transistor having a second common node in common owned by the second transistor; and a fifth transistor having the first and second common nodes; the second column gate comprises sixth and seventh transistors; the second equalizer comprises: an eighth transistor having a third common node in common owned by the sixth transistor; a ninth transistor having a fourth common node in common owned by the seventh transistor; and a tenth transistor having the third and fourth common nodes.

(5) In (4), the one element region comprises the first and second sets of the column gate and the equalizer formed therein in an adjacent manner, wherein diffusion layers of the first and second transistors of the first column gate of the first set are shared by diffusion layers of the sixth and seventh transistors of the second column of the second set.

(6) In (5), the shared diffusion layer is provided with a contact and the gate electrode of the column gate is disposed so as to surround the equalizer.

(7) In (5) or (6), a first set and a second set of the column gate and the equalizer is disposed parallel to a bitline.

(8) In (7), a equalizer control line is disposed normal to the bitline, and the equalizer control line is made of an upper wiring layer than a wiring layer of the bitline.

(9) In (8), at least one bitline precharge voltage supply line is disposed between the first set and the second set disposed in an adjacent manner, the bitline precharge voltage supply line is disposed normal to the bitline, and the bitline precharge voltage supply line is made of an upper wiring layer than a wiring layer of the bitline.

(10) In (8), at least two bitline precharge voltage supply lines are disposed normal to the bitline.

(11) In (10), at least one bitline precharge voltage supply line is disposed at both ends of the first and second sets, which are disposed in an adjacent manner, in a direction parallel to the bitline.

(12) In (10), at least one bitline precharge voltage supply line is disposed at both ends of each of the first and second sets, which are disposed in an adjacent manner, in a direction parallel to the bitline.

(13) In (7), gate electrodes of the equalizers included in a first set and a second set disposed in an adjacent manner are connected to by a common gate wiring.

(14) In (5), the first transistor comprises: a first diffusion region; a second diffusion region, which constitutes the second common node; and a first gate electrode, which is provided between the first and second diffusion regions; the second transistor comprises: a third diffusion region; a fourth diffusion region, which constitutes the second common node; a second gate electrode, which is provided between the third and fourth diffusion regions; the third transistor comprises: the second diffusion region; a fifth diffusion region; a third gate electrode, which is provided between the second and fifth diffusion regions; the fourth transistor comprises: the fourth diffusion region; a sixth diffusion region; a fourth gate electrode, which is provided between the fourth and six diffusion regions; the fifth transistor comprises: the second diffusion region; the fourth diffusion region; a fifth gate electrode, which is provided between the second and fourth diffusion regions; the sixth transistor comprises: a seventh diffusion region; a eighth diffusion region, which constitutes the third node; a sixth gate electrode, which is provided between the seventh and eighth diffusion regions; the seventh transistor comprises: a ninth diffusion region; a tenth diffusion region, which constitutes the fourth node; a seventh gate electrode, which is provided between the ninth and tenth diffusion regions; the eighth transistor comprises: the fifth diffusion region; the eighth diffusion region; a eighth gate electrode, which is provided between the fifth and eighth diffusion regions; the ninth transistor comprises: the sixth diffusion region; the tenth diffusion region; a ninth gate electrode, which is provided between the sixth and tenth diffusion regions; and the tenth transistor comprises: the eighth diffusion region; the tenth diffusion region; a tenth gate electrode, which is provided between the eighth and tenth diffusion regions.

(15) In (14), the first diffusion region is connected to a first data line, the second diffusion region is connected to a first bitline, the third diffusion region is connected to a second data line, the fourth diffusion region is connected to a second bitline, the fifth and sixth diffusion regions are connected to an equalizer voltage supply line, the seventh diffusion region is connected to a third data line, the eighth diffusion region is connected to a third bitline, the ninth diffusion region is connected to a fourth data line and the tenth diffusion region is connected to a fourth bitline, and the first, second, sixth and seventh gate electrodes are connected to a column gate select line and the third, fourth, fifth, eighth, ninth and tenth gate electrodes are connected to a equalizer control line.

(16) In (15), a potential of the equalizer voltage a supply line is a precharge potential of a bitline.

(17) Global pattern is mainly considered and in (4), at least two equalizers are formed in one element region, further comprising an equalizer control line connected to each gate electrode of the third to fifth and eighth to tenth transistors of the two equalizers formed in one element region.

(18) In (17), at least two column gates are formed in one element region and the first to fourth column gates of the adjacent two column gates are connected to a common control line.

(19) In (4), at least two column gates are formed in one element region and the first to fourth column gates of the adjacent two column gates are connected to a common control line.

According to the present invention, at least one set of an element pattern of a column gate and an element pattern of an equalizer is formed in the same element region. Thus, a contact between a bitline and a diffusion region can be shared, in which a contact has conventionally been required for each, so that the number of contacts can be reduced in a sense amplifier section. Therefore, a bitline capacitance in the sense amplifier section can be reduced, which enables a high speed operation and low power consumption in a sense operation to be achieved. Besides, it is possible to increase a gate width of a transistor for supplying a precharge voltage in an equalizer and to realize a high speed operation in an equalizing operation as compared with a conventional technique of its kind. Since a space between adjacent bitlines can be larger as compared with a conventional case, an improvement on wiring margin of a bitline can be obtained, which makes a production yield increased. In addition, since element patterns of a column gate and an equalizer are formed in the same element region, an area for a sense amplifier section can be decreased as compared with the case where both patterns are separately disposed.

In the present invention, element patterns of a column gate and an equalizer are formed in the same element region and thereby a bitline contact can be shared by the column gate and the equalizer, which enables the number of bitline contacts to be decreased. Therefore, a bitline capacitance in the sense amplifier section is reduced and furthermore a high speed operation and low power consumption in a sense operation can be achieved. Since element patterns of a column gate and an equalizer are formed in the same element region, a high speed operation in an equalizing operation and an improvement in wiring margin of a bitline, reduction of an area for a sense amplifier section and the like can be realized.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinbefore.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3A is a view showing a part of the pattern of FIG. 2 and FIGS. 3B, 3C are respectively views showing structures in section taken along line 3B—3B and 3C—3C of FIG. 3A;

FIG. 9 is a view showing a third wiring layer, a contact for connecting the second wiring layer to the third wiring layer, and a contact for connecting the third wiring layer to a fourth wiring layer in the example of the first layout according to an embodiment of the present invention;

FIG. 10 is a view showing a fourth wiring layer, and a contact for connecting the third wiring layer to the fourth wiring layer in the example of the first layout according to an embodiment of the present invention;

FIG. 15 is a view showing a third wiring layer, a contact for connecting the second wiring layer to the third wiring layer, and a contact for connecting the third wiring layer to a fourth wiring layer in the example of the second layout according to an embodiment of the present invention;

FIG. 16 is a view showing a fourth wiring layer, and a contact for connecting the third wiring layer to the fourth wiring layer in the example of the second layout according to an embodiment of the present invention;

FIG. 25 is a view showing a third wiring layer, a contact for connecting the second wiring layer to the third wiring layer, and a contact for connecting the third wiring layer to a fourth wiring layer in the example of the fourth layout according to an embodiment of the present invention;

FIG. 26 is a view showing a fourth wiring layer, and a contact for connecting the third wiring layer to the fourth wiring layer in the example of the fourth layout according to an embodiment of the present invention;

FIG. 34 is a view showing a second wiring layer, a contact for connecting the first wiring layer to the second wiring layer, and a contact for connecting the second wiring layer to a third wiring layer in the example of the sixth layout according to an embodiment of the present invention;

FIG. 35 is a view showing a third wiring layer, a contact for connecting the second wiring layer to the third wiring layer, and a contact for connecting the third wiring layer to a fourth wiring layer in the example of the sixth layout according to an embodiment of the present invention;

FIG. 36 a view showing a fourth wiring layer, and a contact for connecting the third wiring layer to the fourth wiring layer in the example of the sixth layout according to an embodiment of the present invention;

FIG. 45 is a view showing a third wiring layer, a contact for connecting the second wiring layer to the third wiring layer, and a contact for connecting the third wiring layer to a fourth wiring layer in the example of the eighth layout according to an embodiment of the present invention; and FIG. 46 a view showing a fourth wiring layer, and a contact for connecting the third wiring layer to the fourth wiring layer in the example of the eighth layout according to an embodiment of the present invention.

DETAILED DESCRIPTION OF THE INVENTION

Embodiments of the present invention will be described in reference to the accompanying drawings below.

Figure 1:
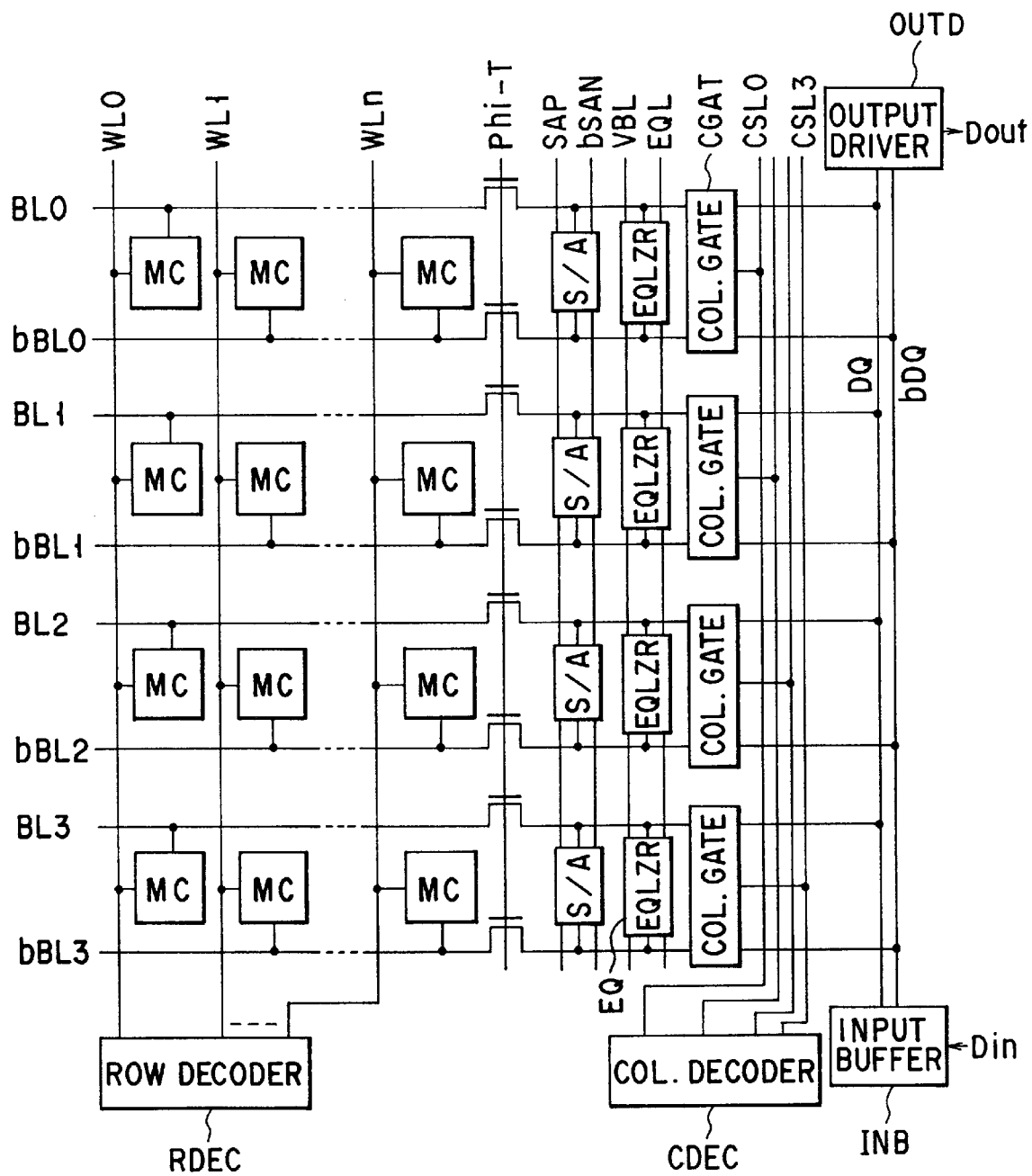
FIG. 1 is a view showing an outline of structure of a DRAM according to an embodiment of the present invention.
Figure 2:
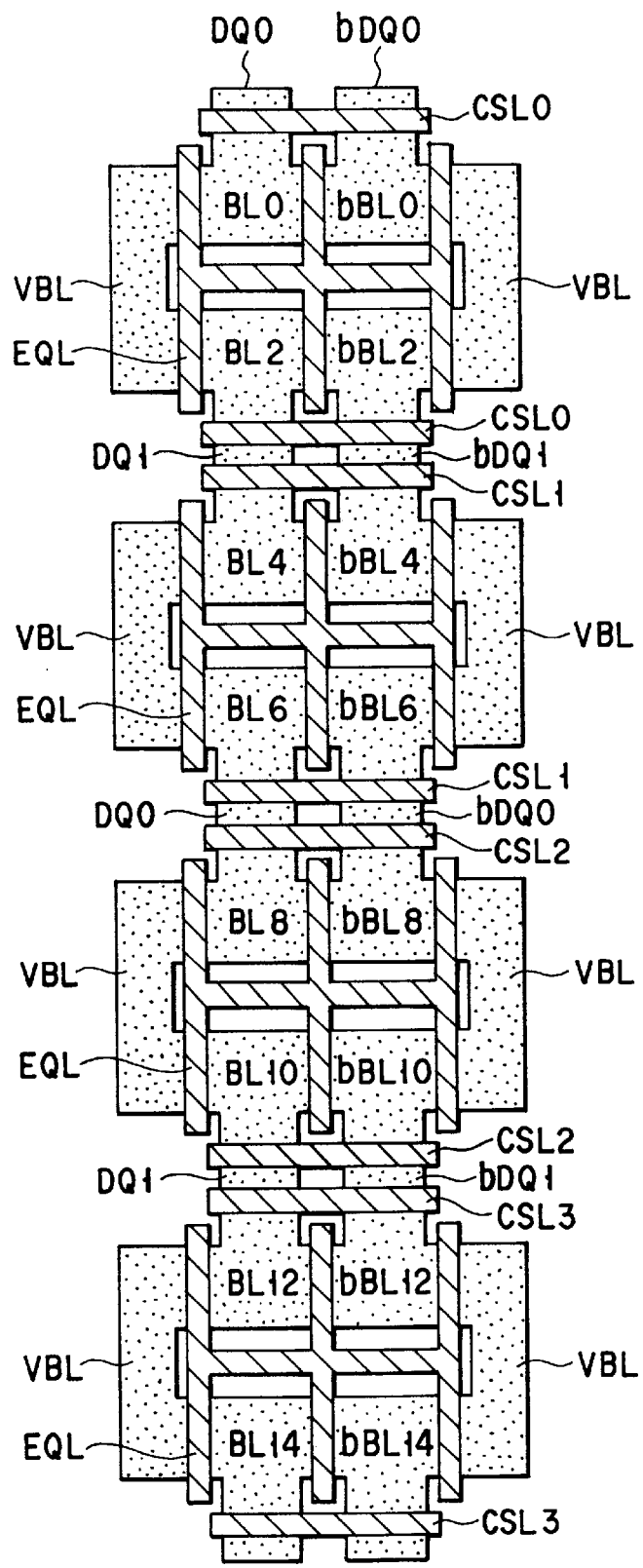
FIG. 2 is a view showing a layout of a transistor constituting a column gate and a bitline equalizer included in a sense amplifier section of a DRAM according to an embodiment of the present invention.
Figure 4:
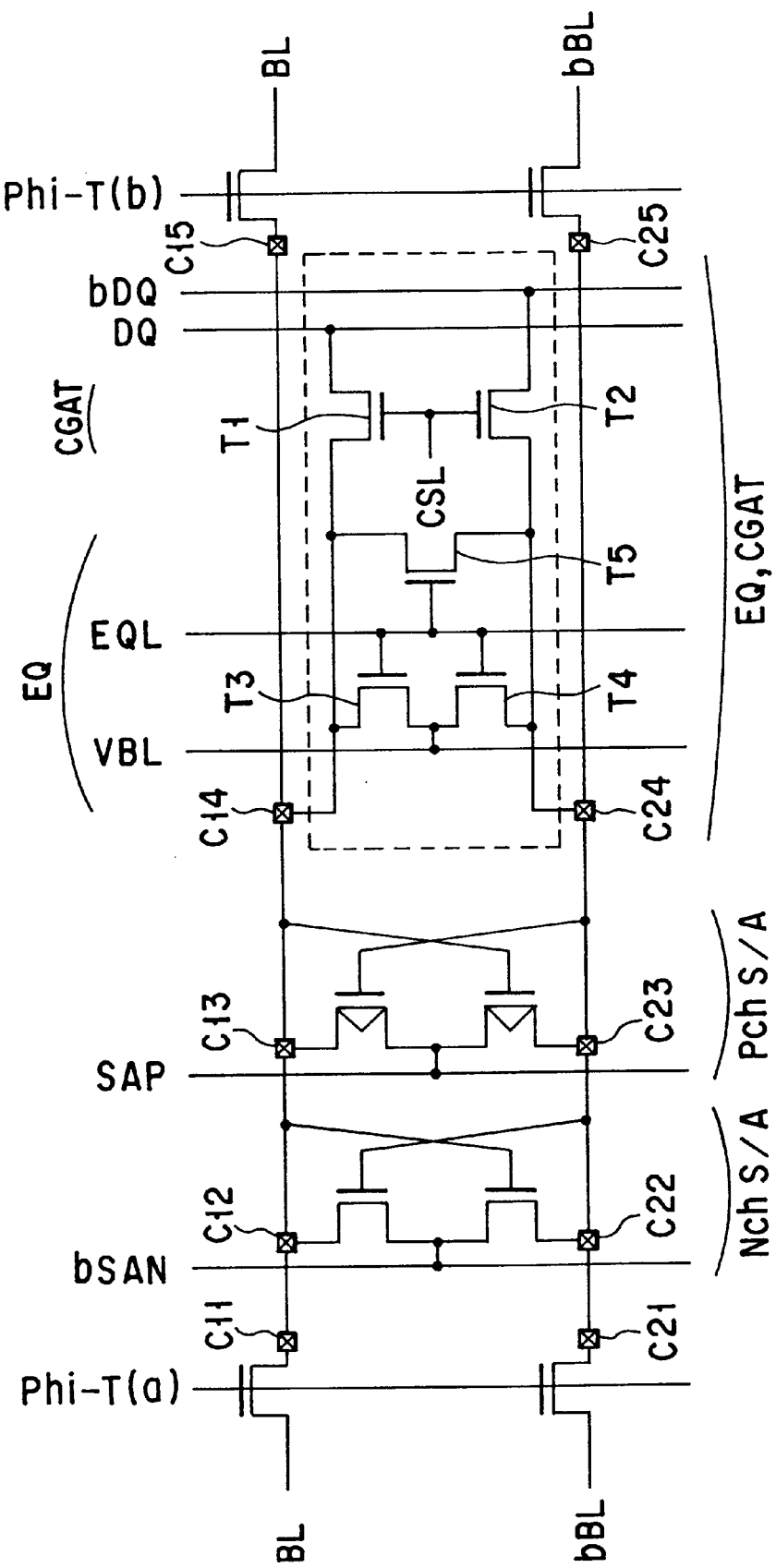
FIG. 4 is an equivalent circuit of a sense amplifier section according to an embodiment of the present invention.

A basic structure of an embodiment according to the present invention will be described in reference to FIGS. 1 to 4. FIG. 1 is a view showing an outline of structure of a DRAM according to an embodiment of the present invention. FIG. 2 is a view showing patterns of a column gate and a bitline equalizer included in a sense amplifier section of a DRAM. FIG. 3A is a view showing a part of the pattern of FIG. 2 and FIGS. 3B, 3C are respectively views showing structures in section taken along line 3B—3B and 3C—3C of FIG. 3A. FIG. 4 is an equivalent circuit of a sense amplifier section.

In FIG. 1, an MC indicates a memory cell, an S/A indicates a sense amplifier, an EQ indicates a bitline equalizer, a CGAT indicates a column gate, an OUTD indicates an output driver, an INB indicates an input buffer, a RDEC indicates a row decoder, a CDEC indicates a column decoder, BL0 to BL3 indicate bitlines, bBL0 to bBL3 indicate bitlines, each of which constitutes pairs with the BL0 to BL3 bitlines, WL0 to WLn indicate wordlines, a Phi-T indicates a transfer gate control line, SAP and bSAN indicate sense amplifier drive lines, a VBL indicates a precharge voltage supply line, an EQL indicates a bitline equalizer control line, CSL0 to CSL3 indicate column gate select lines, a DQ indicates a data line, a bDQ indicates a data line which constitutes a pair with DQ, a Din indicates an input terminal, and a Dout indicates an output terminal. In the other figures, the constituents same as or corresponding to those described above are respectively indicated by the same reference symbols.

In FIGS. 3A to 3B, G1 to G10 indicate gate electrodes, S1 to S10 indicate diffusion regions constituting source or drain and N1 to N4 indicate common nodes. Gate electrodes G1, G2, G6 and G7 are connected to a column gate select line CSL0 and gate electrodes G3, G4, G5, G8, G9 and G10 are connected to a bitline equalizer control line EQL. Diffusion regions S1, S3, S7 and S9 are respectively connected to data lines DQ0, bDQ0, DQ1 and bDQ1, diffusion regions S2, S4, S8 and S10 are respectively connected to bitlines BL0, bBL0, BL2 and bBL2, and diffusion regions S5, S6 are connected to a precharge voltage supply line VBL. FIG. 2 shows a constitution, wherein a plurality of combinations of a column gate and an equalizer shown in FIG. 3 are connected in series, and a diffusion region of the equalizer is shared by a column gate adjacent to the equalizer. Descriptions on the constituents are omitted since they can be easily inferred from the drawings in FIGS. 3A to 3B.

In FIG. 4, MOS transistors T1 and T2 constitute a column gate CGAT and MOS transistors T3, T4 and T5 constitute a bitline equalizer EQ. FIG. 4 shows contacts C11 to C15 between a bitline BL and each of the diffusion regions of transistors included in a sense amplifier section and contacts C21 to C25 between a bitline bBL and each of the diffusion regions of transistors included in the sense amplifier section.

In the embodiment, as characteristically shown in FIG. 2 and FIGS. 3A to 3C, there is formed a composite element pattern constructed by merging element patterns of a column gate and an equalizer. An example shown in FIGS. 3A to 3C will be described. A transistor having a gate G1 (a transistor constituting a column gate), a transistor having a gate G3 (a transistor constituting a bitline equalizer), and a transistor having a gate G5 (a transistor constituting a bitline equalizer), in common, have a diffusion region S2 which works as a common node N1. In a similar manner, common nodes N2, N3 and N4 are respectively shared by a transistor constituting a column gate and two transistors constituting a bitline equalizer. Besides, the common nodes N1, N2, N3 and N4 (diffusion regions S2, S4, S8 and S10) are respectively connected to bitlines BL0, bBL0 and bitlines BL1, bBL1.

In such a manner, since a transistor constituting a column gate and a transistor constituting a bitline equalizer share a diffusion region, one bitline contact can be shared by the column gate and the bitline equalizer, whereas conventionally bitline contacts have respectively been provided to the column gate and the bitline equalizer. Therefore, with respect to a column gate and a bitline equalizer, the number of bitline contacts can be decreased to a half as compared to a conventional technique.

Figure 5:
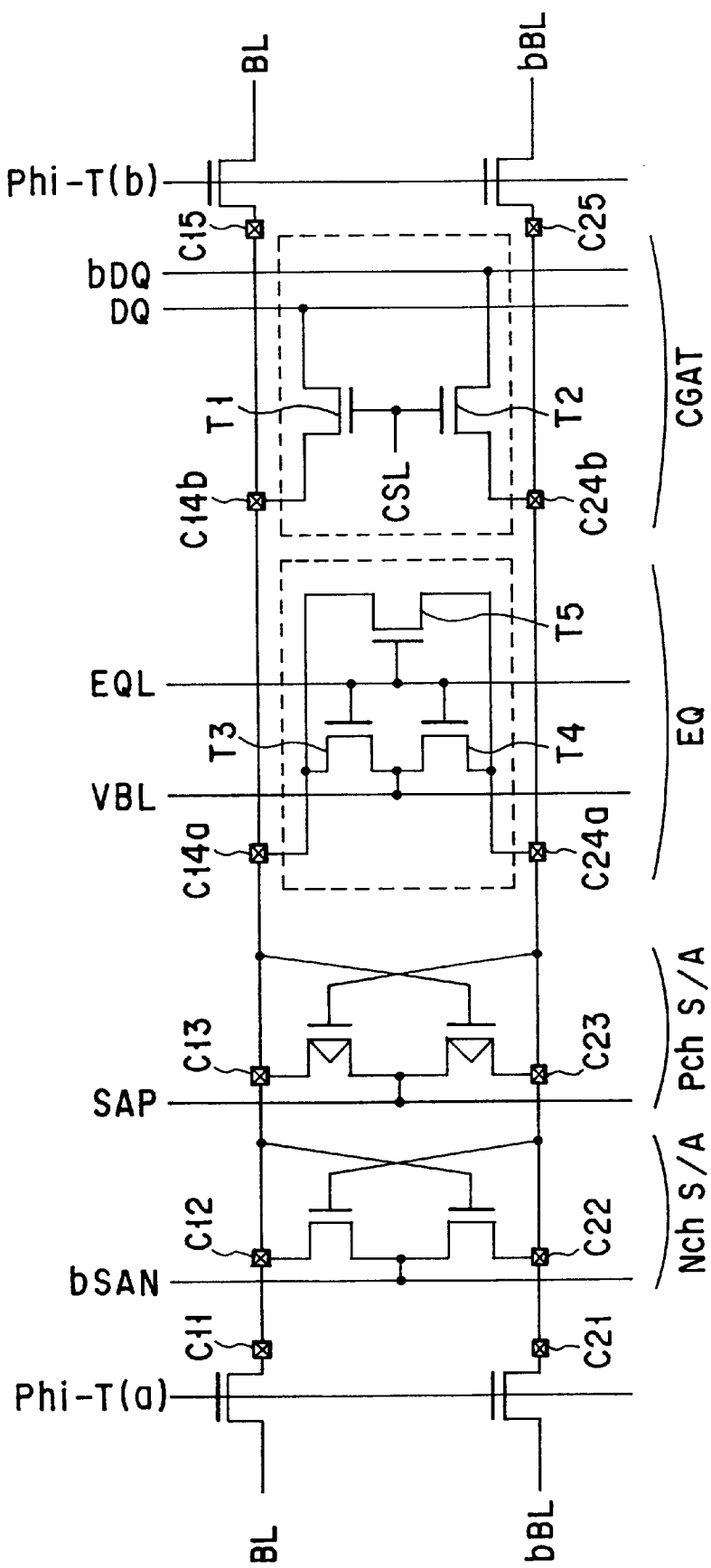
FIG. 5 is an equivalent circuit showing an example of a sense amplifier section in a conventional technique.

FIG. 4 shows the above mentioned circumstances by use of a circuit and as shown in the figure, a column gate CGAT and a bitline equalizer EQ share a bitline contact (C14 for a bitline BL and C24 for a bitline bBL). FIG. 5 is an equivalent circuit of a conventional sense amplifier section. Conventionally, since a column gate CGAT and a bitline equalizer EQ have separately disposed, different bitline contacts (C14a and C14b for a bitline BL, and C24a and C24b for a bitline bBL) are respectively required for a column gate CGAT and a bitline equalizer EQ. In the whole of the sense amplifier of the embodiment, the number of bitline contacts is reduced to five-sixth as compared with a conventional constitution.

As described above, in the present invention, since one diffusion region is shared by a transistor constituting a column gate and a transistor constituting a bitline equalizer, one bitline contact can be shared by the column gate and the bitline equalizer, so that the number of bitline contacts in a sense amplifier section can be reduced. Therefore, a bitline capacitance in a sense amplifier section can be decreased, and a high speed operation and low power consumption in a sense operation can be realized.

Conventionally, since gate widths of transistors T3, T4 connecting VBL of a bitline equalizer and bitlines BL, bBL therebetween cannot be large in layout, drivability of a transistor have been unable to be sufficiently secured. In the embodiment, since gate widths of the transistors T3, T4 can be broadened to the same as a gate width of a transistor T5 which connects bitlines of a bitline equalizer therebetween, drivability of the transistors T3, T4 can sufficiently be secured and thereby a high speed operation in equalizing operation can be realized.

Then, examples of layout patterns obtained on the basis of the structure shown by the basic embodiment above will be described in a concrete manner.

In each of the following examples of layout patterns, "layer#n" indicates a nth layer ("layer#0 o) means a lowest level layer (0th layer), "layer#4" means an uppermost level layer (a 4th layer)) and "cont-xy" indicates indicates a contact from "layer#y" to "layer#x."

Figure 6:
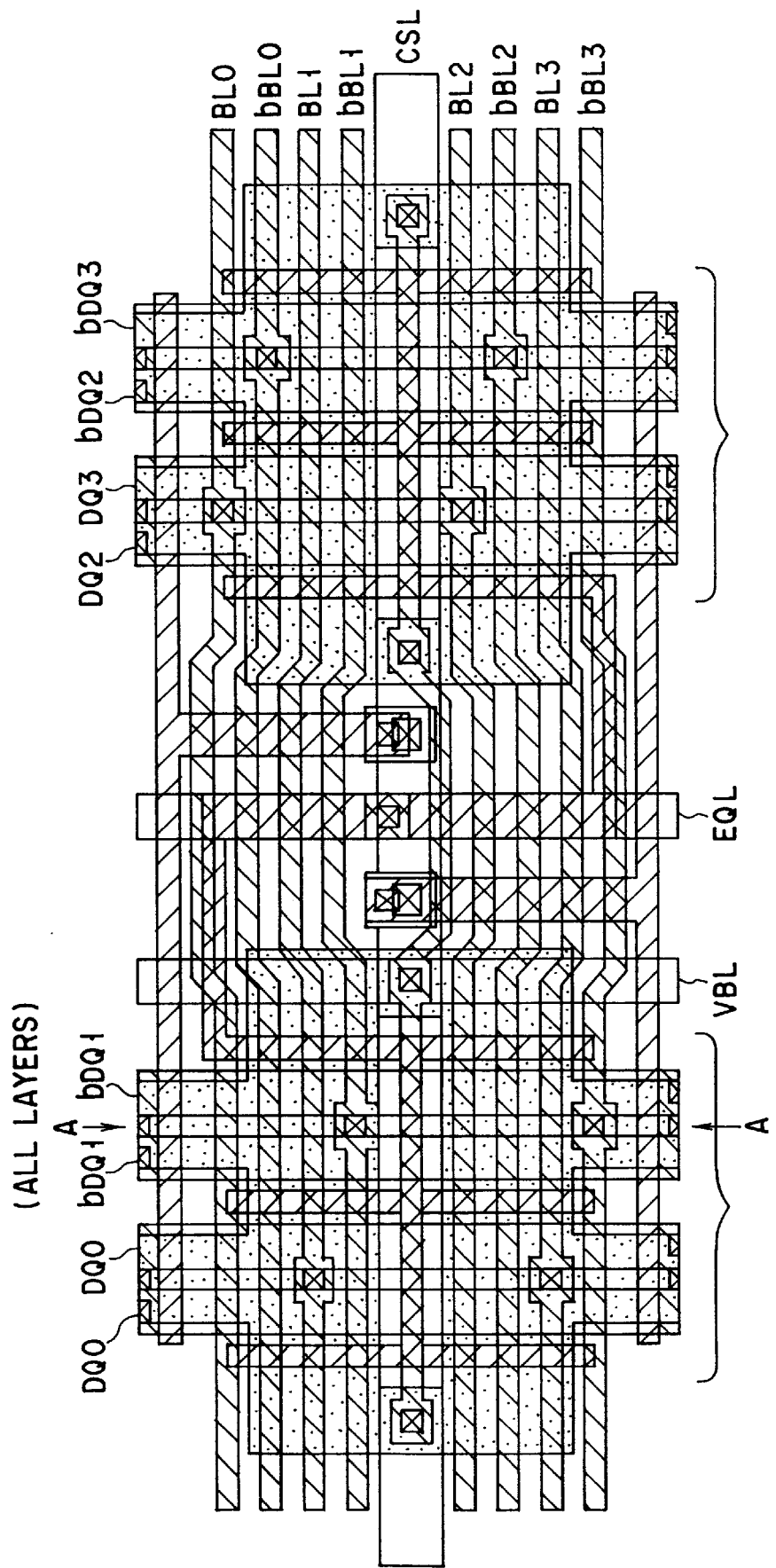
FIG. 6 is a view showing an example of a first layout pattern according to an embodiment of the preset invention.
Figure 7:
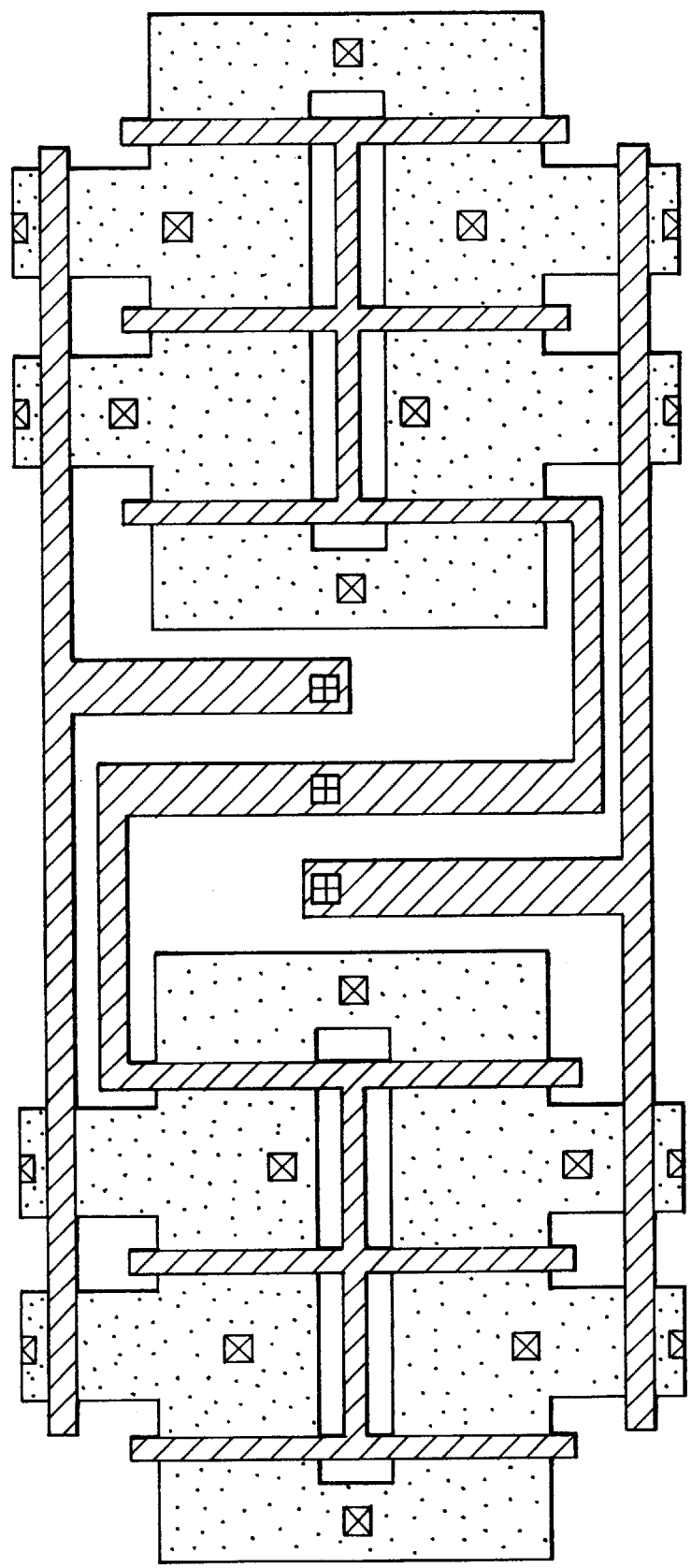
FIG. 7 is a view showing an element region, first wiring layer, and a contact for connecting the first wiring layer to a second wiring layer in the example of the first layout according to an embodiment of the present invention.
Figure 8:
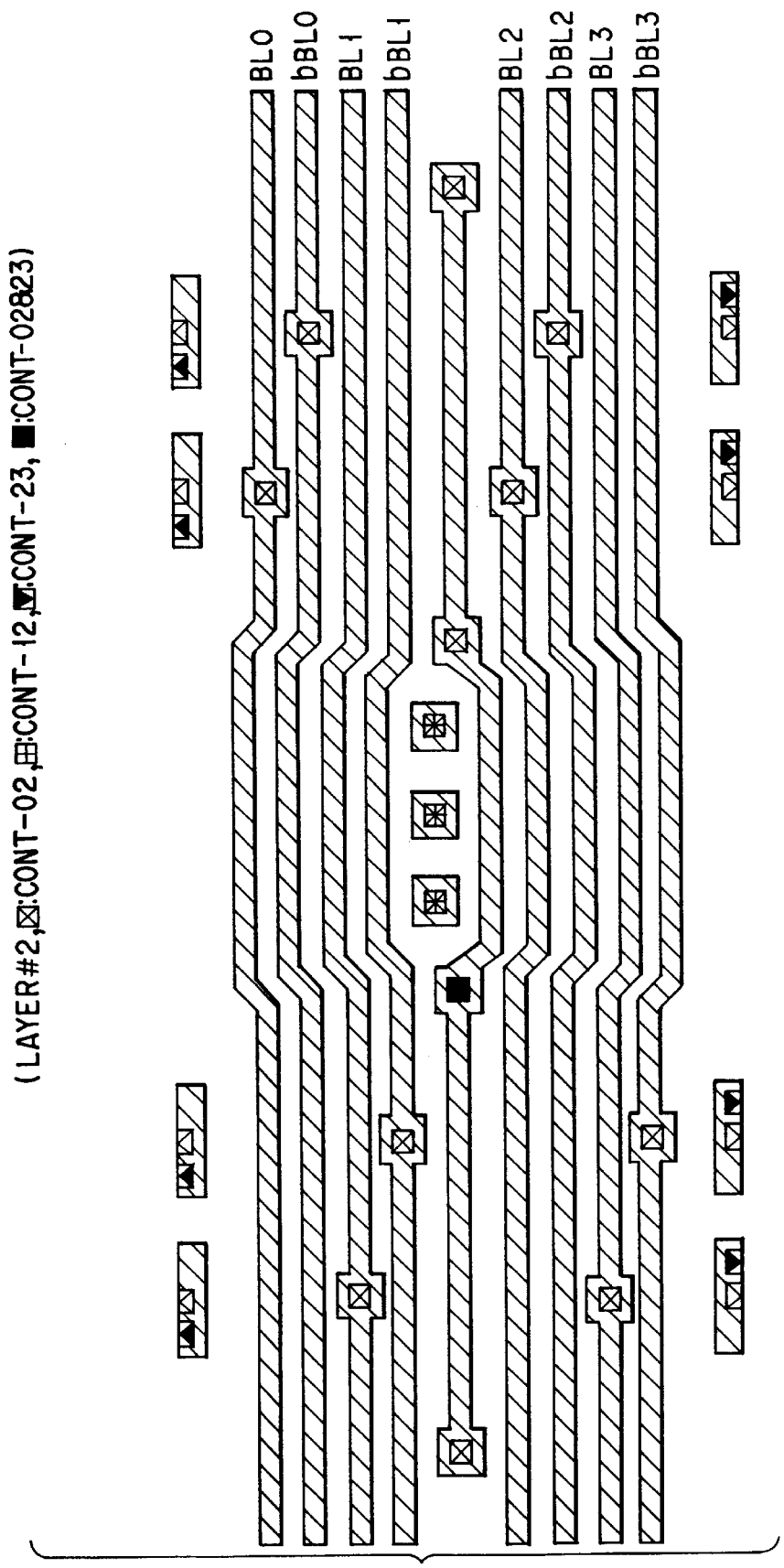
FIG. 8 is a view showing a second wiring layer, a contact for connecting the first wiring layer to the second wiring layer, and a contact for connecting the second wiring layer to a third wiring layer in the example of the first layout according to an embodiment of the present invention.

The example of the first layout pattern will be described in reference to FIGS. 6 to 10. FIG. 6 shows all the layers and all the contacts of a layout example, FIG. 7 shows layer#0, layer#1, cont-02, and cont-12, FIG. 8 shows layer#2, cont-02, cont-12 and cont-23, FIG. 9 shows layer#3, cont-23 and cont-34 and FIG. 10 shows layer#4 and cont-34.

In the example of the layout pattern (other examples of the layout patterns are similar to the example of the layout pattern), there is shown the case where when one column select line CSL is activated, information from four pairs of bitlines is output to four pairs of DQ lines. In the example of the layout pattern (other examples of the layout patterns are similar to the example of the layout pattern), left and right regions of FIG. 6 as viewed (regions indicated by "{" in FIG. 6) comprises a pattern like a pattern shown in FIGS. 3A to 3C formed therein (see a pattern shown in FIG. 7). In FIG. 6, along a direction of a DQ line, the same patterns are formed and two patterns are formed in symmetry with respect a boundary line (a boundary line means a line intersecting a DQ line or the like on the figure and other examples of the layout patterns are similar to the example of the layout pattern in this regard).

Figure 11:
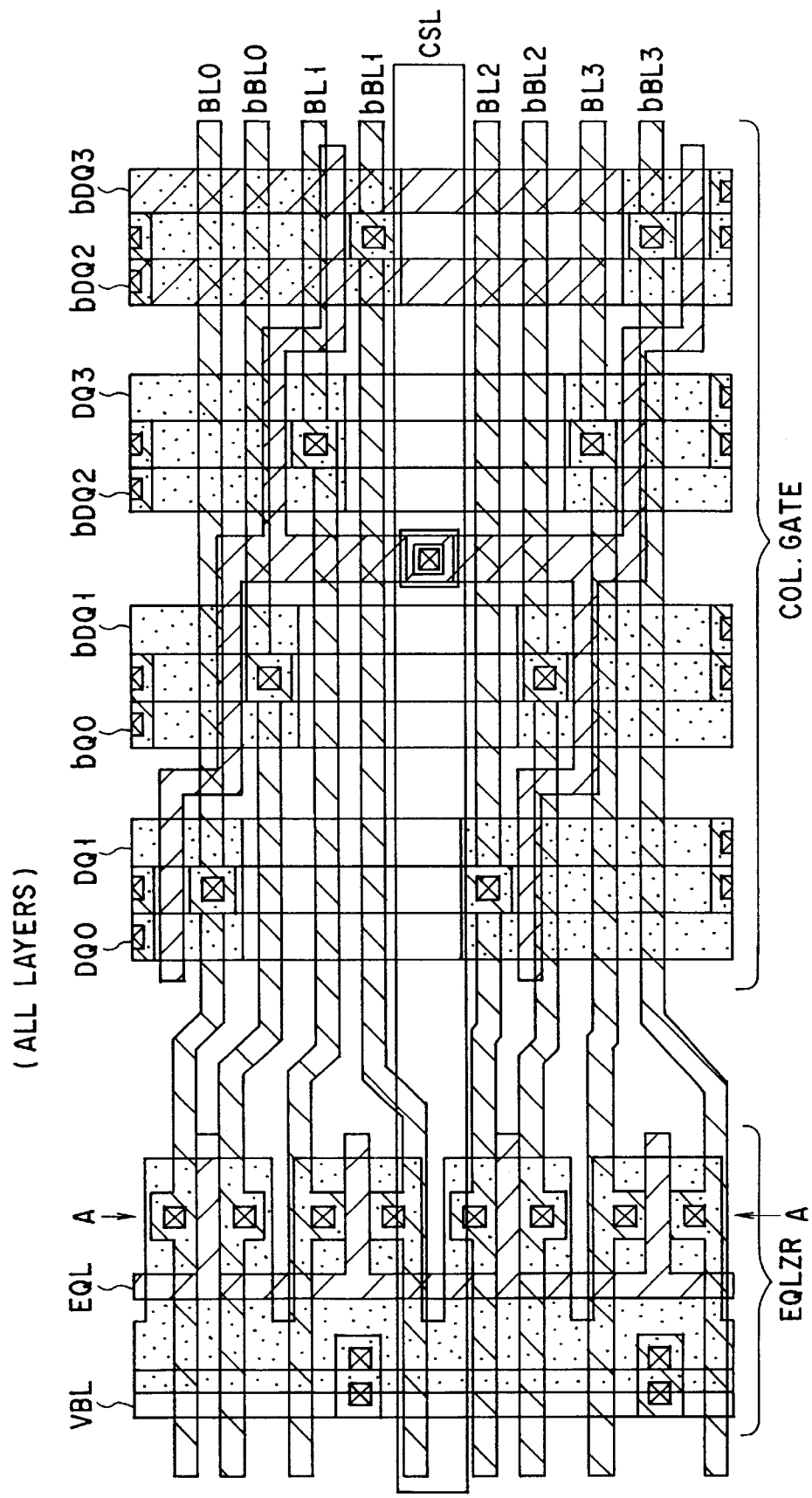
FIG. 11 is a view showing a layout example according to an conventional technique.

Here, a wiring margin of a bitline will be considered. In the case where a example of the layout pattern as shown in FIG. 11 is assumed as a conventional example of a layout pattern, the severest wiring margin of a bitline is shown in a portion A—A of FIG. 11. On the other hand, in FIG. 6, the severest wiring margin of a bitline is shown in a portion A—A of FIG. 6. Here, the minimum line width of a bitline is L, the minimum space between adjacent bitlines is S and the minimum width of a bitline contact is C, and it is assumed that a space between a bitline contact and a channel of a transistor is equal to a positioning margin between a bitline and bitline contact.

In a conventional example shown in FIG. 11, in the case where four equalizers are disposed, a width requirement for forming a bitline is expressed by [8C+8S]. In the example shown in FIG. 6, the width requirement is expressed as [3C+17S]. For example, if it is assumed that C=0.5 $\mu$m, L=0.25 $\mu$m and S=0.25 $\mu$m, a width requirement for forming a bitline when four equalizers are disposed is 6 $\mu$m in a conventional example shown in FIG. 11, whereas a width requirement is 5.75 $\mu$m in the example shown in FIG. 6.

In such a manner, in the present invention, a space between adjacent bitlines can be broader than in a conventional technique and a wiring margin of a bitline can be improved.

In the conventional example shown in FIG. 11, patterns of a column gate and an equalizer are separately disposed in different regions. In contrast to this, in the present invention, as shown in FIG. 6, since element patterns of a column gate and a bitline equalizer are merged (i.e., formed in the same element region), an area for a sense amplifier section can be reduced.

In the embodiment, a bitline equalizer control line EQL is formed between element regions provided in the left and right sides of FIG. 6 (other examples of the layout patterns are similar to the example of the layout pattern in this regard). Therefore, a gate wiring up to each transistor can be shortened, which contributes to a high speed operation.

The example in which gate electrodes of adjacent equalizers are commonly connected is shown in FIG. 6, in addition to this, gate electrodes of column gates may be commonly connected.

Figure 12:
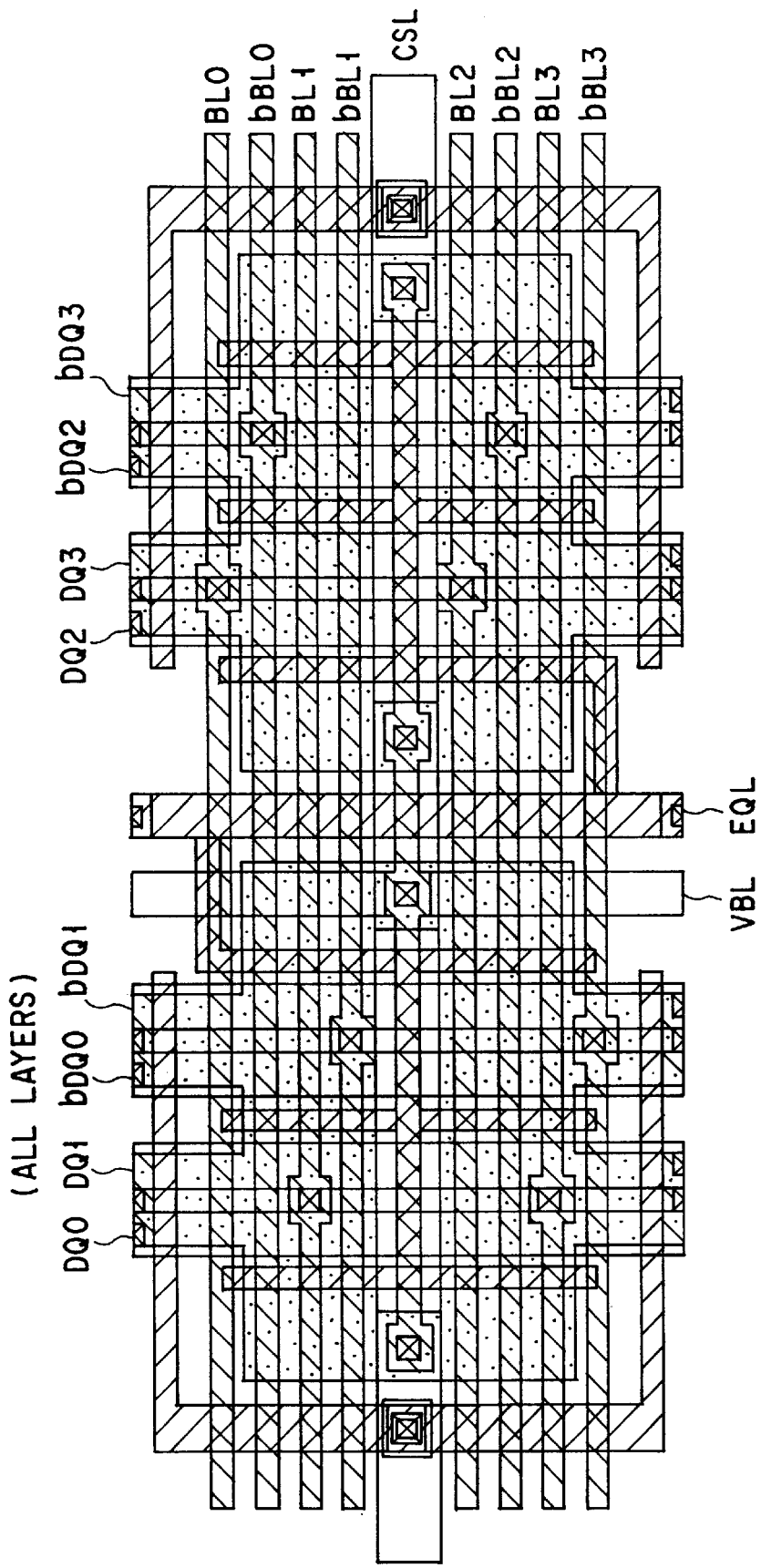
FIG. 12 is a view showing an example of a second layout pattern according to an embodiment of the preset invention.
Figure 13:
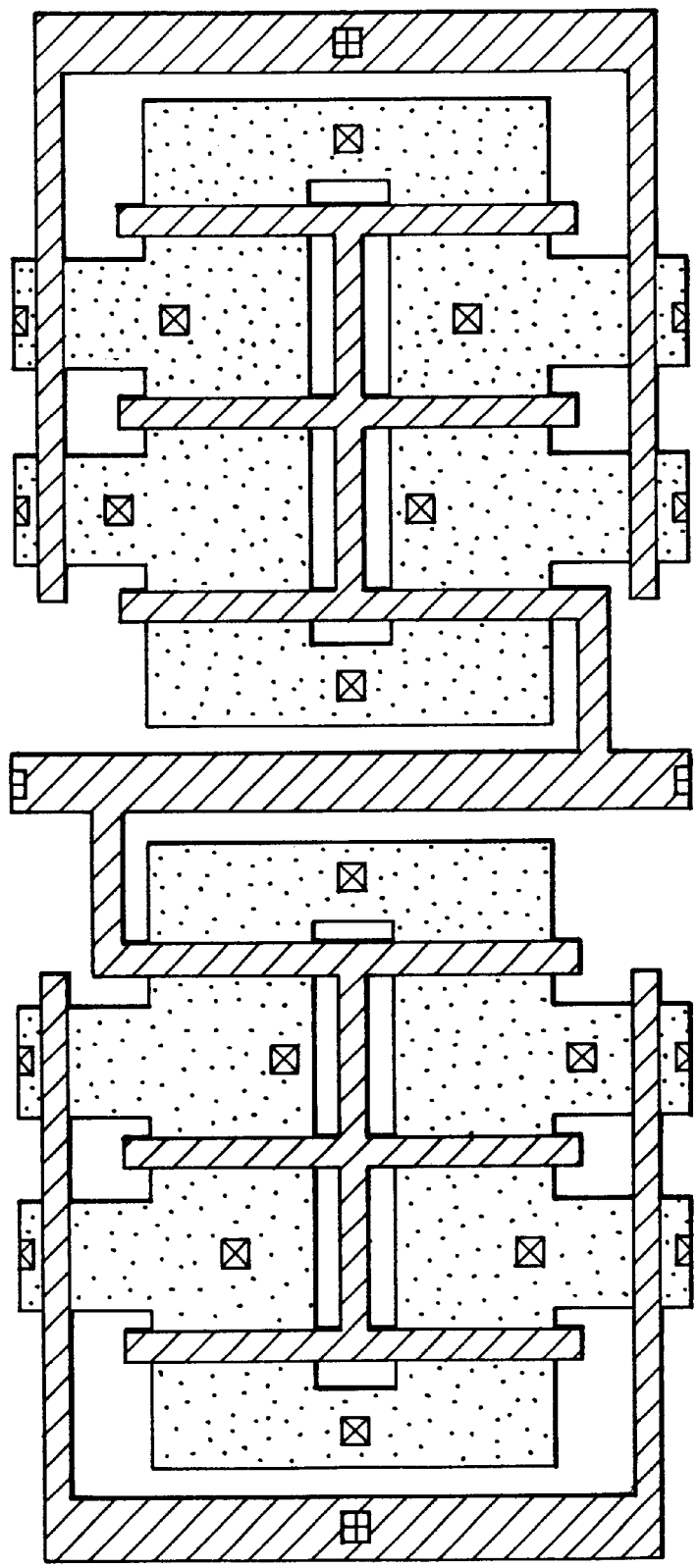
FIG. 13 is a view showing an element region, first wiring layer, and a contact for connecting the first wiring layer to a second wiring layer in the example of the second layout according to an embodiment of the present invention.
Figure 14:
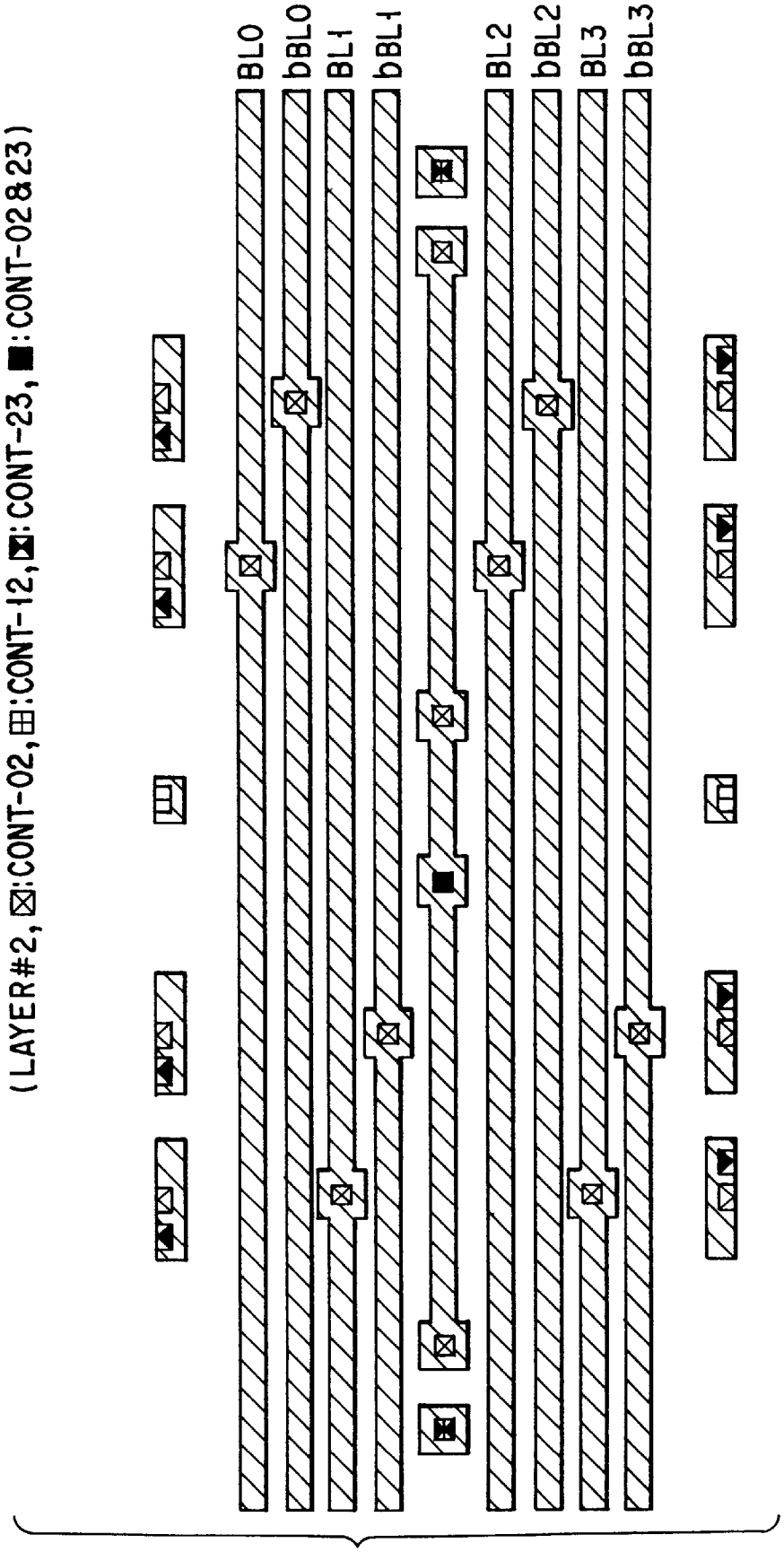
FIG. 14 is a view showing a second wiring layer, a contact for connecting the first wiring layer to the second wiring layer, and a contact for connecting the second wiring layer to a third wiring layer in the example of the second layout according to an embodiment of the present invention.

The example of the second layout pattern will be described in reference to FIGS. 12 to 16. FIG. 12 shows all the layers and all the contacts of a example of the layout pattern, FIG. 13 shows layer#0, layer#1, cont-02 and cont-12, FIG. 14 layer#2, cont-02, cont-12 and cont-23, FIG. 15 layer#3, cont-23 and cont-34 and FIG. 16 layer#4 and cont-34.

In the example, wirings to a column gate are disposed on the both sides of the column gate and a bitline equalizer and a bitline equalizer control line EQL is disposed in the center so as to penetrate through a plurality of columns. Thereby, bitline wiring in the middle to a column gate and a bitline equalizer is simplified.

Figure 17:
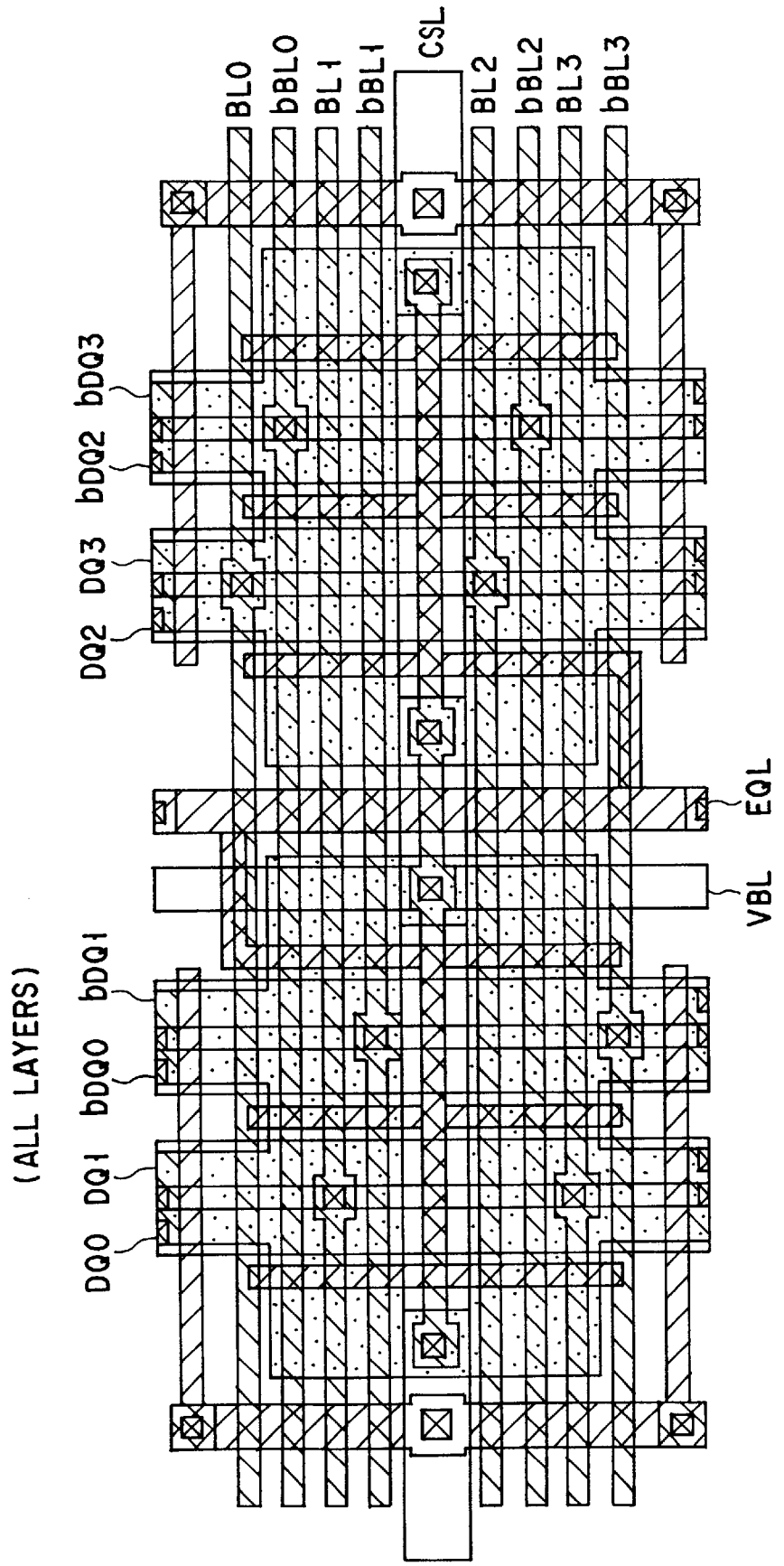
FIG. 17 is a view showing an example of a third layout pattern according to an embodiment of the preset invention.
Figure 18:
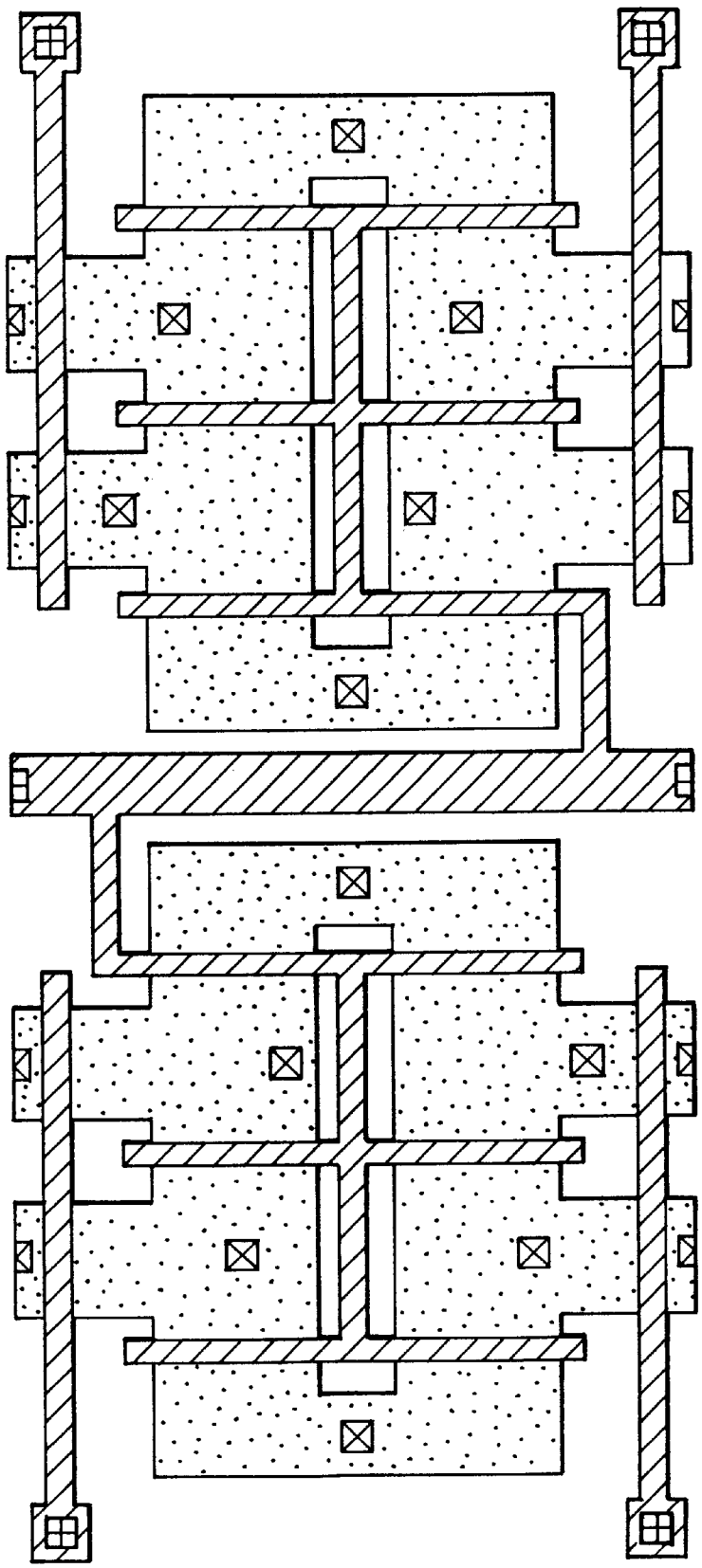
FIG. 18 is a view showing an element region, first wiring layer, and a contact for connecting the first wiring layer to a second wiring layer in the example of the third layout according to an embodiment of the present invention.
Figure 19:
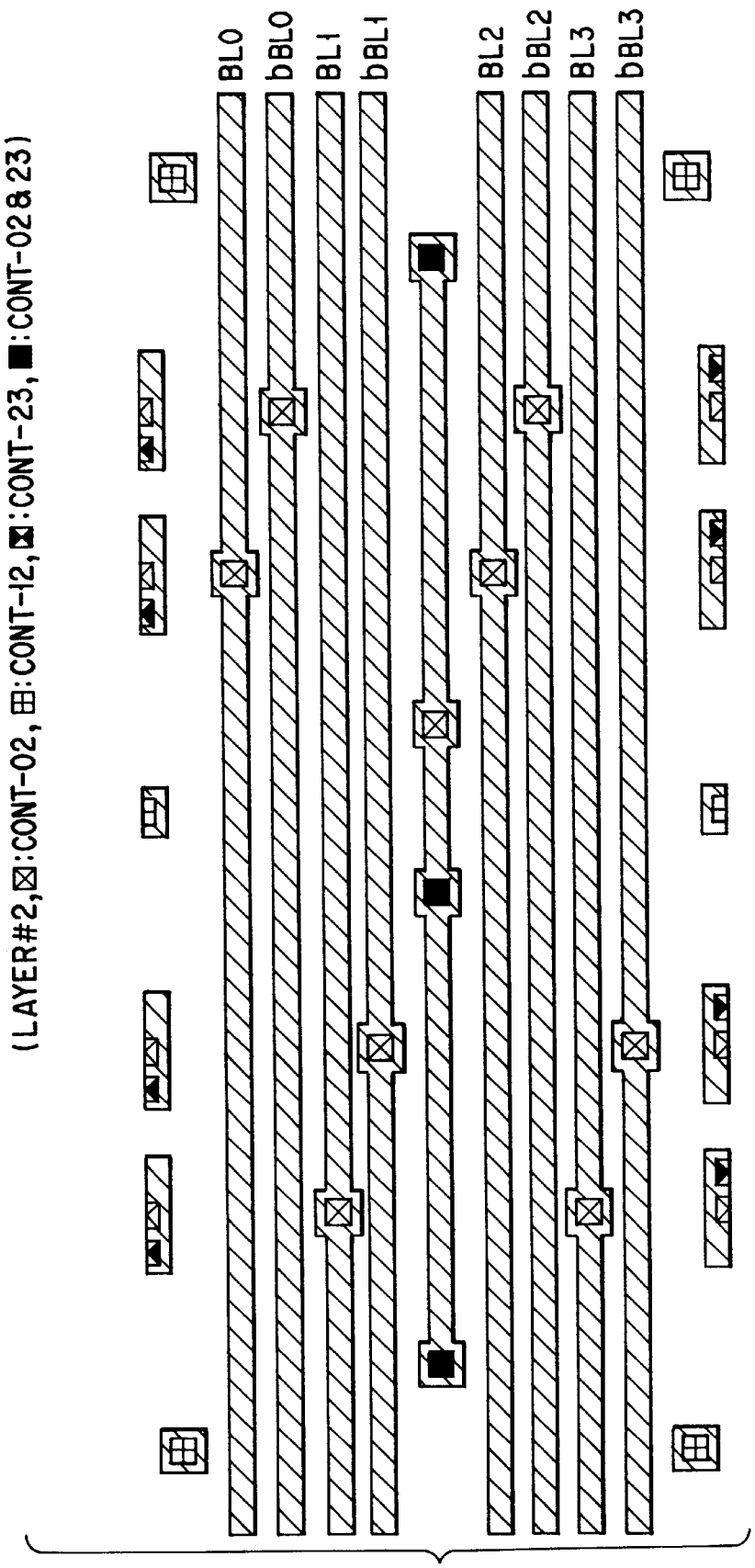
FIG. 19 is a view showing a second wiring layer, a contact for connecting the first wiring layer to the second wiring layer, and a contact for connecting the second wiring layer to a third wiring layer in the example of the third layout according to an embodiment of the present invention.
Figures 20, 21:
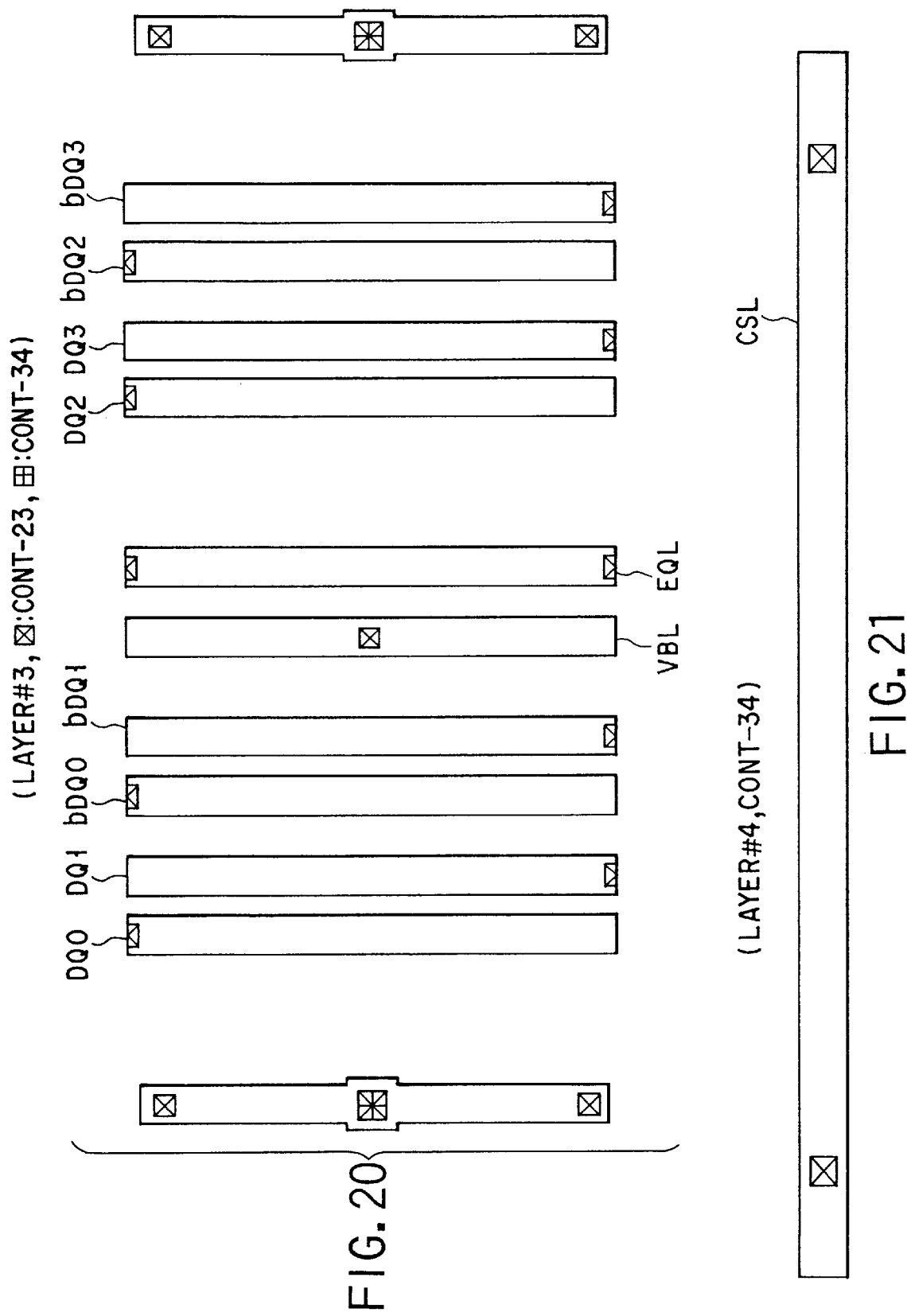
FIG. 20 is a view showing a third wiring layer, a contact for connecting the second wiring layer to the third wiring layer, and a contact for connecting the third wiring layer to a fourth wiring layer in the example of the third layout according to an embodiment of the present invention.
FIG. 21 is a view showing a fourth wiring layer, and a contact for connecting the third wiring layer to the fourth wiring layer in the example of the third layout according to an embodiment of the present invention.

The third layout example will be described in reference to FIGS. 17 to 21. FIG. 17 shows all the layers and all the contacts of a layout example, FIG. 18 shows layer#0, layer#1, cont-02 and cont-12, FIG. 19 layer#2, cont-02, cont-12 and cont-23, FIG. 20 layer#3, cont-23 and cont-34 and FIG. 21 layer#4 and cont-34.

In the example, as is in the example of the second layout pattern, wirings to a column gate are disposed on the both sides of the column gate and a bitline equalizer and a bitline equalizer control line EQL is disposed in the center so as to penetrate through a plurality of columns. What is different from the example of the second layout pattern is that wirings to a column gate are formed by use of a wiring in an upper layer than a bitline on both sides of a column gate and an equalizer and thus occupancy areas of a column gate and an bitline equalizer along a bitline direction are decreased.

Figure 22:
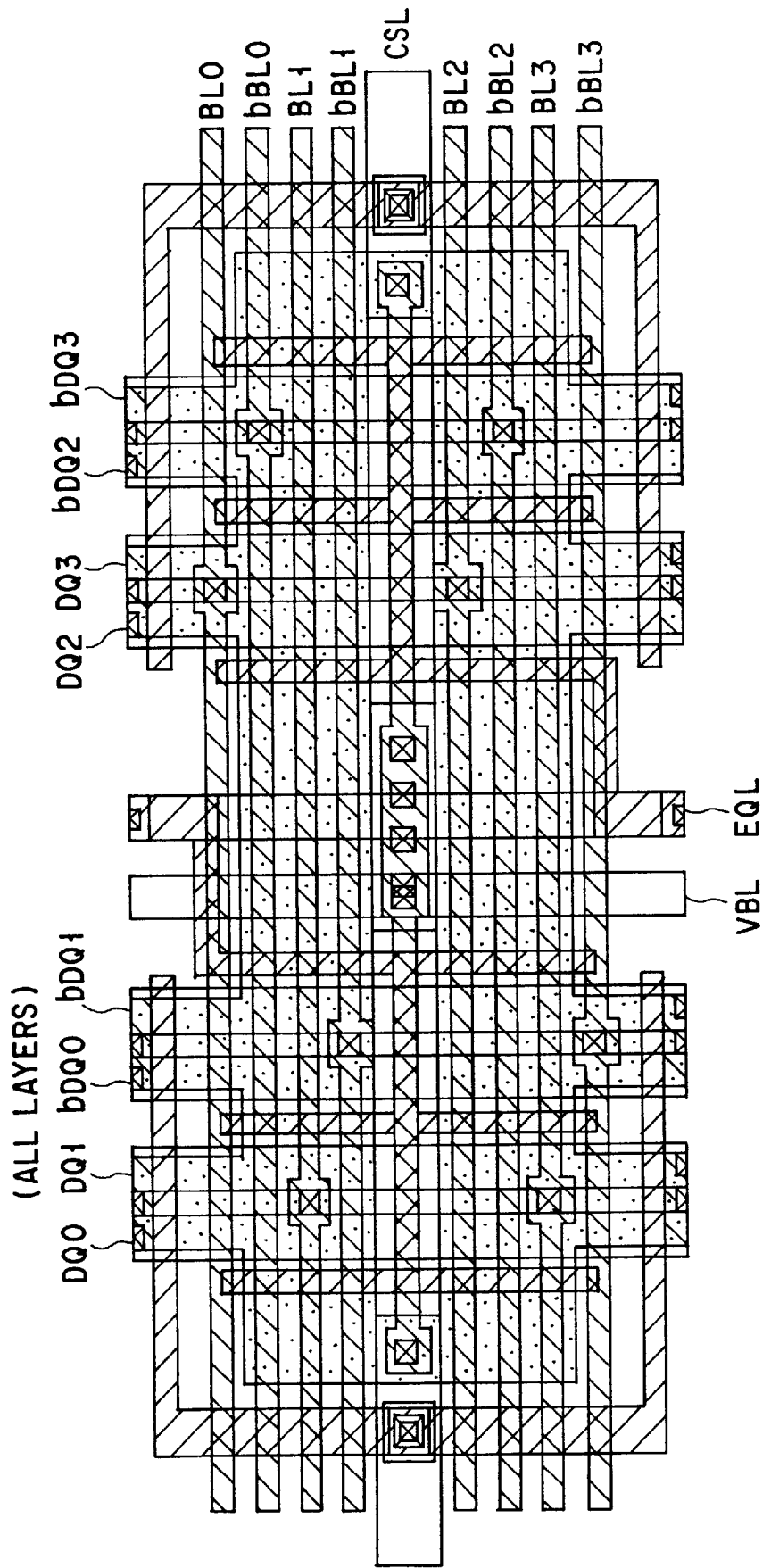
FIG. 22 is a view showing an example of a fourth layout pattern according to an embodiment of the preset invention.
Figure 23:
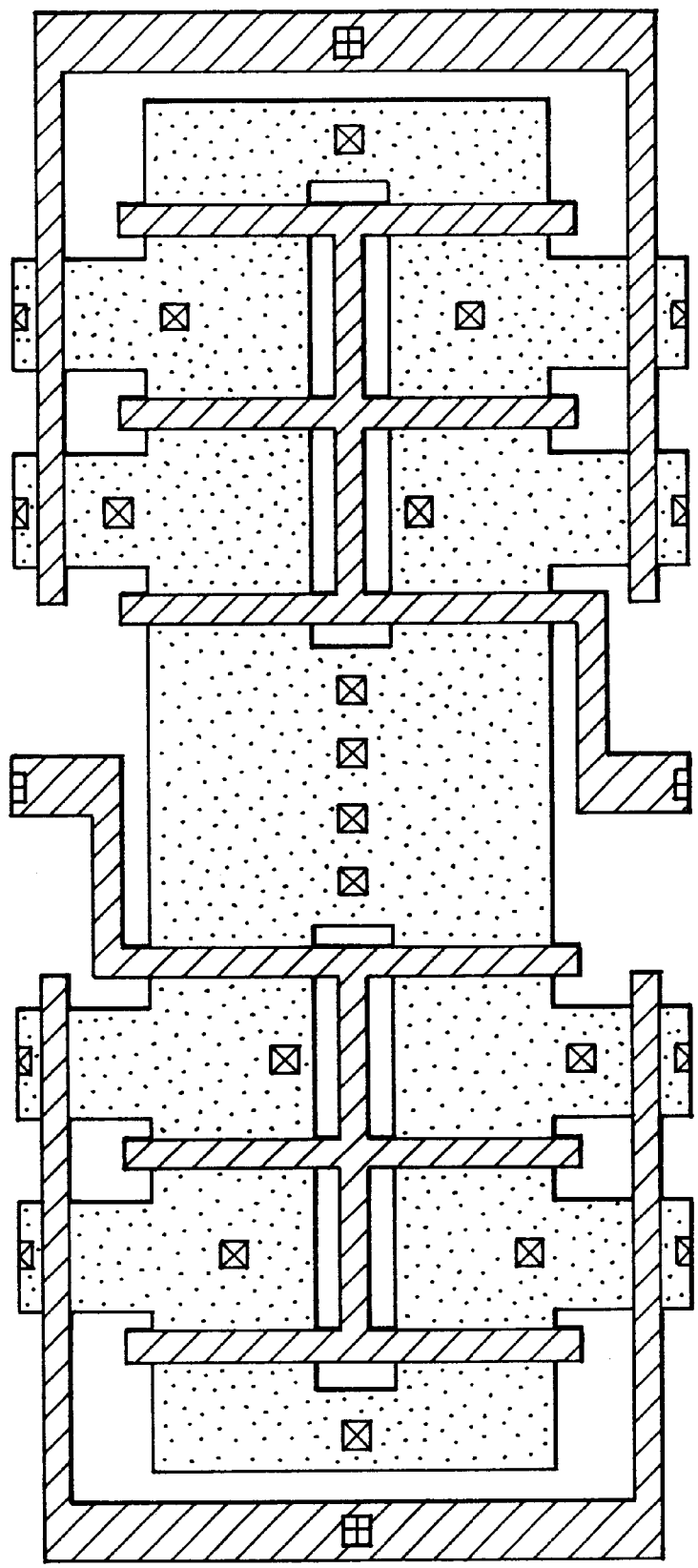
FIG. 23 is a view showing an element region, first wiring layer, and a contact for connecting the first wiring layer to a second wiring layer in the example of the fourth layout according to an embodiment of the present invention.
Figure 24:
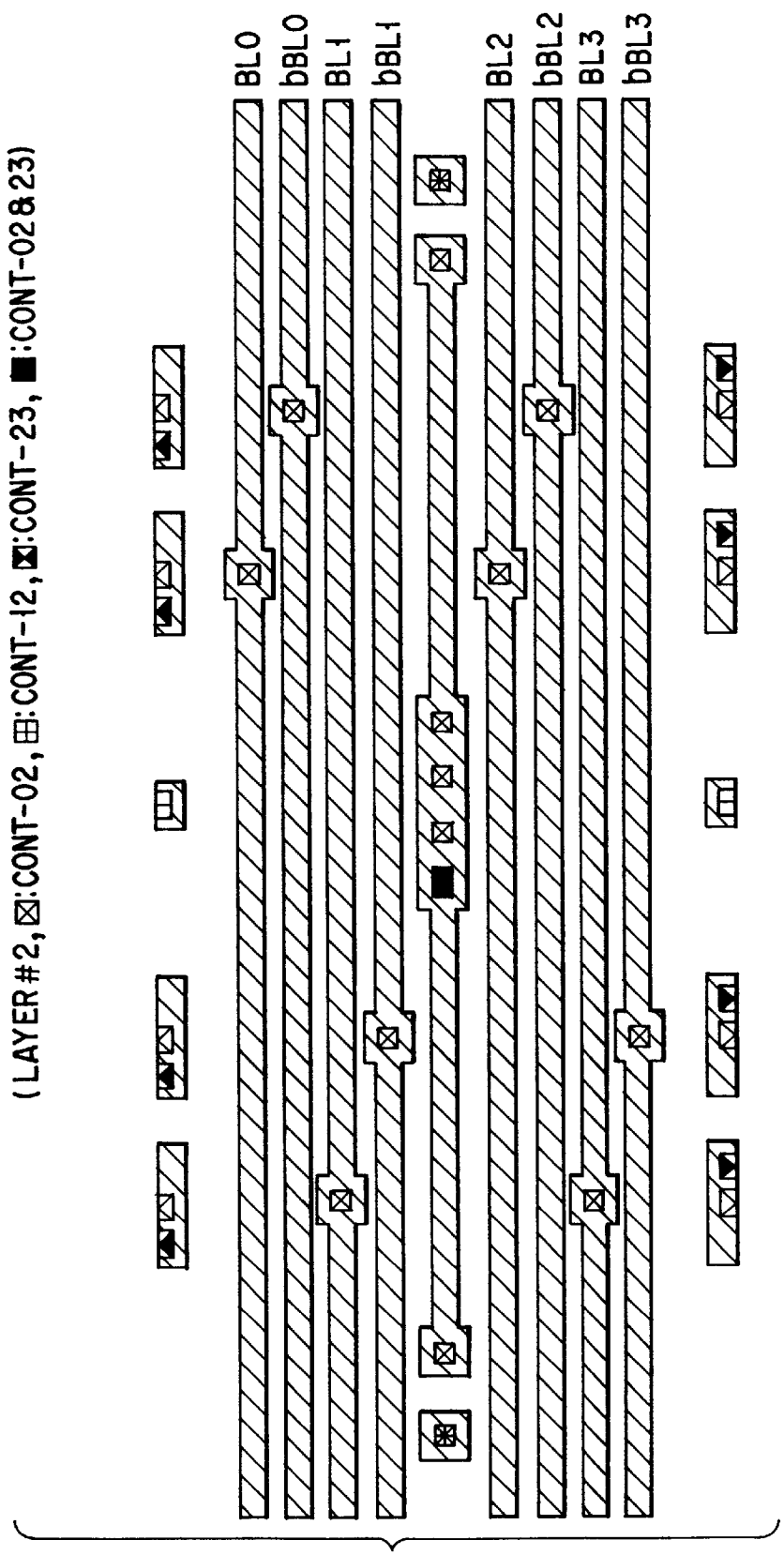
FIG. 24 is a view showing a second wiring layer, a contact for connecting the first wiring layer to the second wiring layer, and a contact for connecting the second wiring layer to a third wiring layer in the example of the fourth layout according to an embodiment of the present invention.

The example of the fourth layout pattern will be described in reference to FIGS. 22 to 26. FIG. 22 shows all the layers and all the contacts of a layout example, FIG. 23 shows layer#0, layer#1, cont-02, and cont-12, FIG. 24 shows layer#2, cont-02, cont-12 and cont-23, FIG. 25 shows layer#3, cont-23 and cont-34 and FIG. 26 shows layer#4 and cont-34.

In the example, wirings to a column gate are disposed on the both sides of a column gate and a bitline equalizer and the column gate and the bitline equalizer, which are disposed separately, leftward and rightward, in the examples of the first to third layout patterns, are connected to each other in a diffusion region. Thereby, a contact of a precharge voltage supply line VBL can be large in area. Besides, occupancy areas of a column gate and a bitline equalizer along a bitline direction can be decreased.

Figure 27:
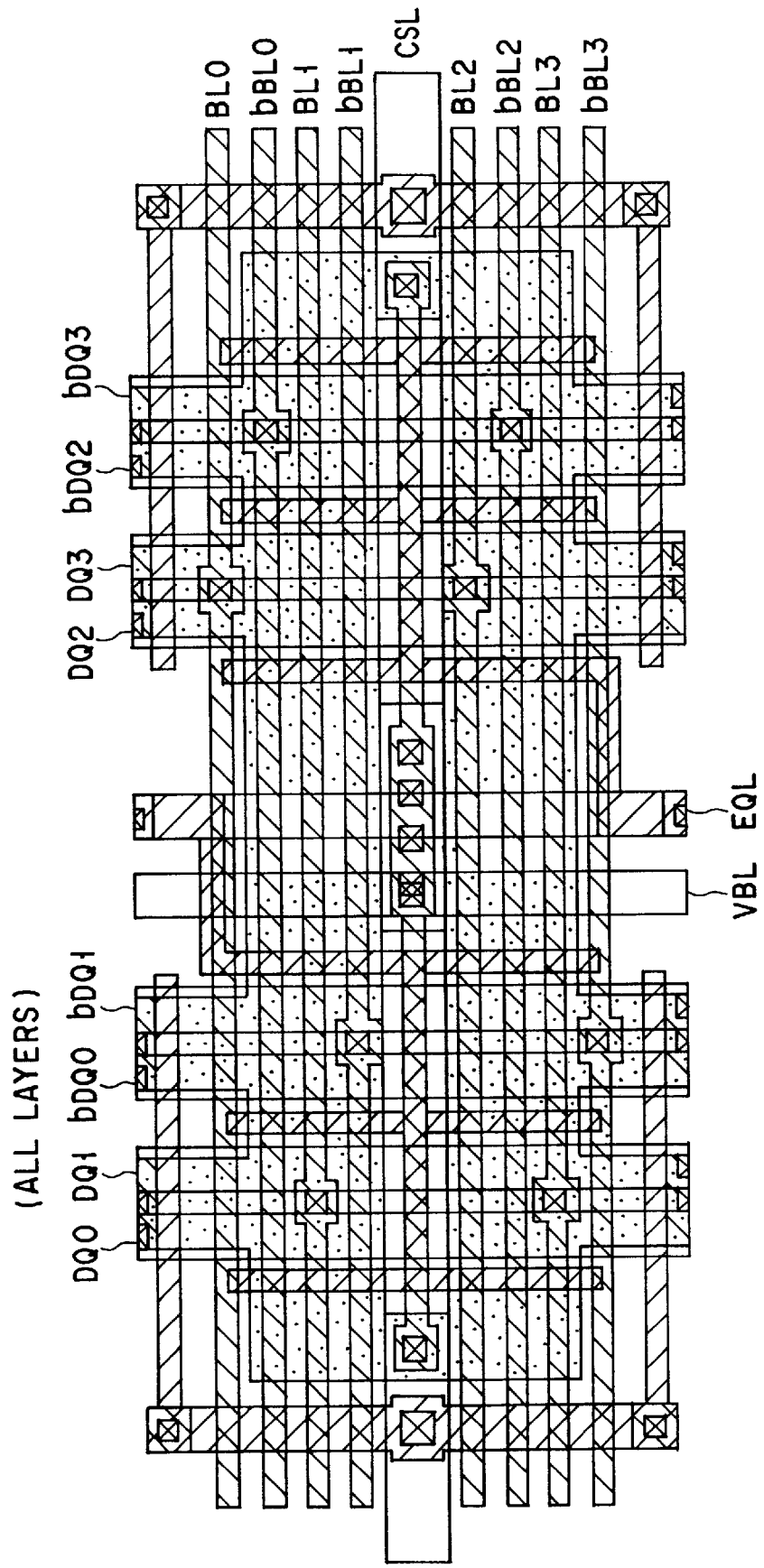
FIG. 27 is a view showing an example of a fifth layout pattern according to an embodiment of the preset invention.
Figure 28:
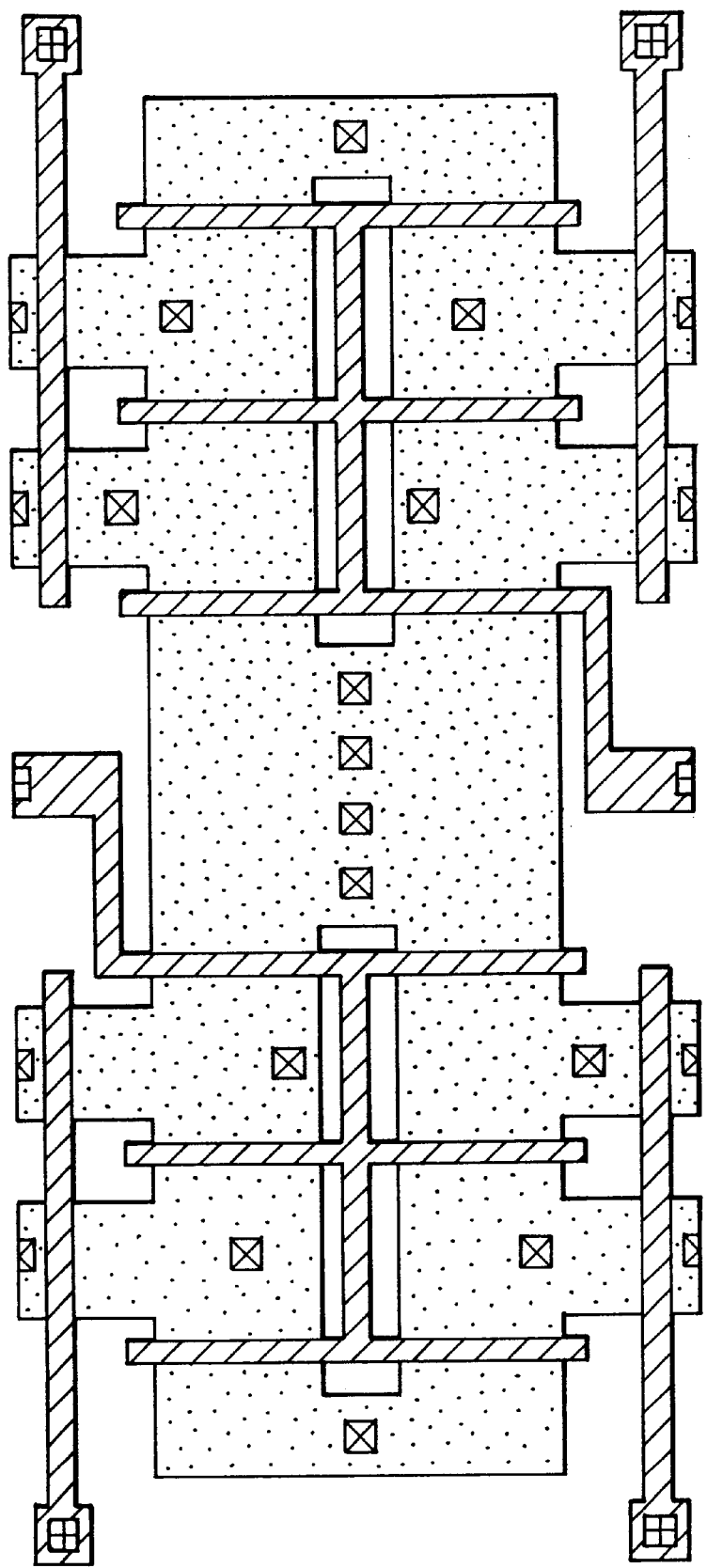
FIG. 28 is a view showing an element region, first wiring layer, and a contact for connecting the first wiring layer to a second wiring layer in the example of the fifth layout according to an embodiment of the present invention.
Figure 29:
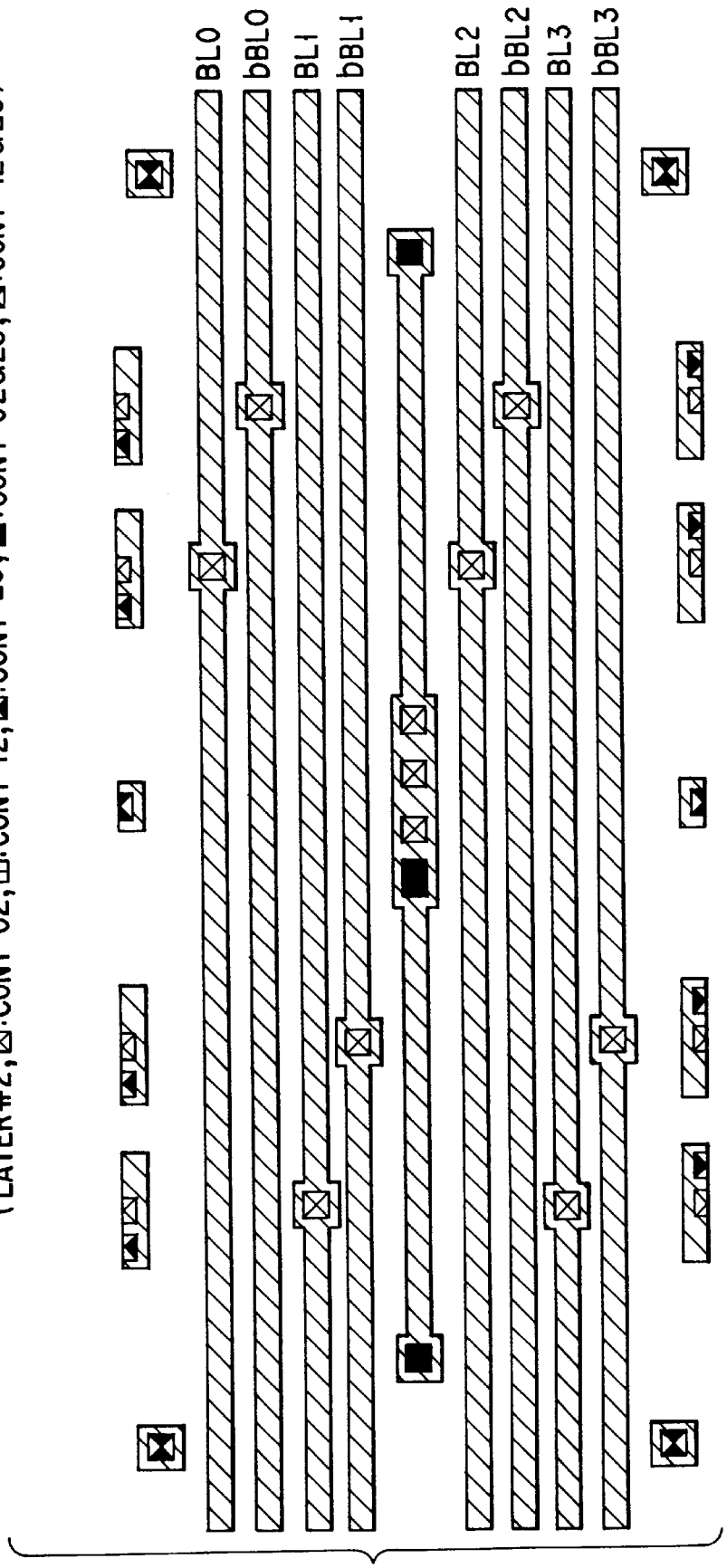
FIG. 29 is a view showing a second wiring layer, a contact for connecting the first wiring layer to the second wiring layer, and a contact for connecting the second wiring layer to a third wiring layer in the example of the fifth layout according to an embodiment of the present invention.
Figures 30, 31:
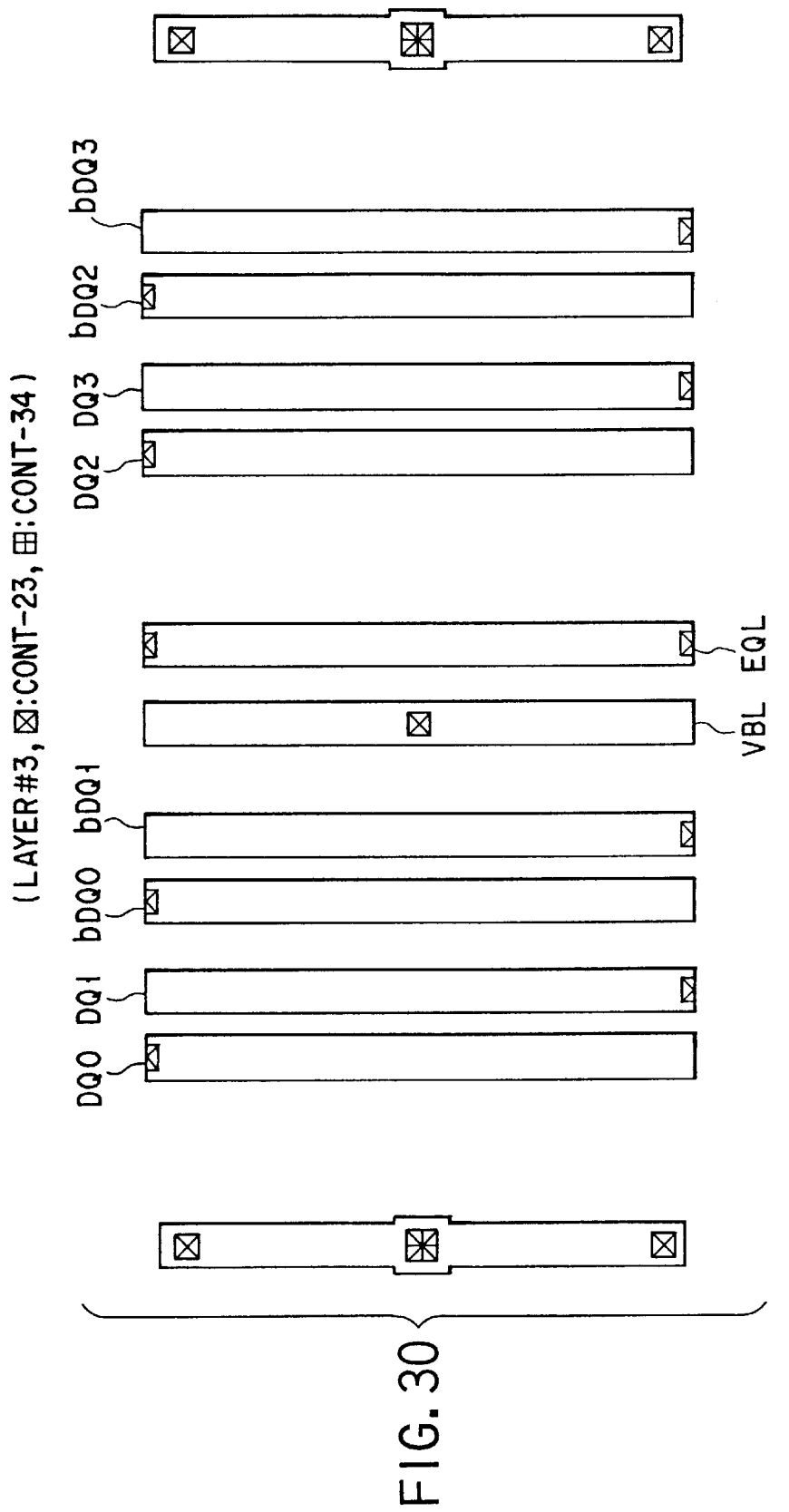
FIG. 30 is a view showing a third wiring layer, a contact for connecting the second wiring layer to the third wiring layer, and a contact for connecting the third wiring layer to a fourth wiring layer in the example of the fifth layout according to an embodiment of the present invention.
FIG. 31 a view showing a fourth wiring layer, and a contact for connecting the third wiring layer to the fourth wiring layer in the example of the fifth layout according to an embodiment of the present invention.
Figure 32:
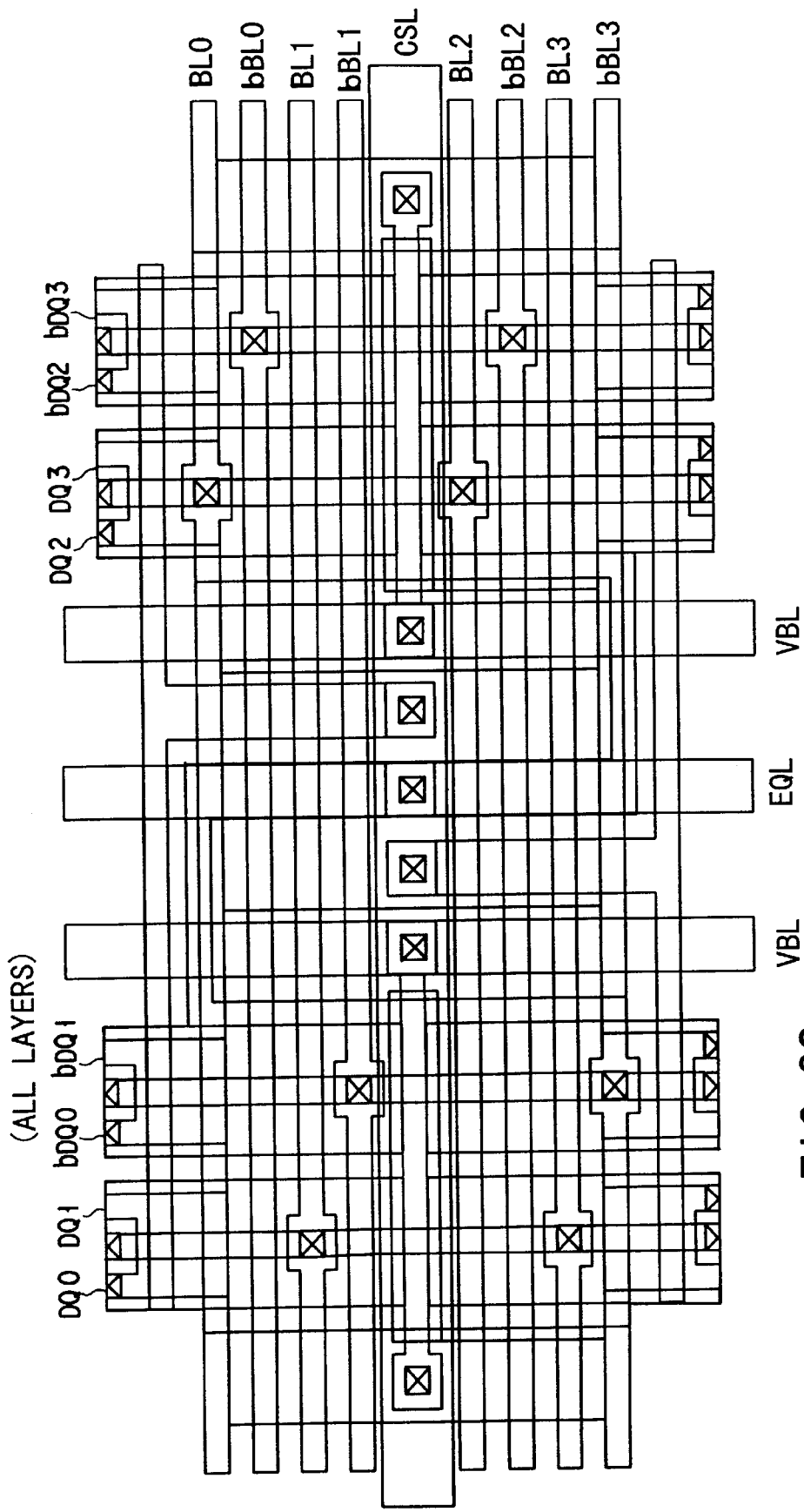
FIG. 32 is a view showing an example of a sixth layout pattern according to an embodiment of the preset invention.
Figure 33:
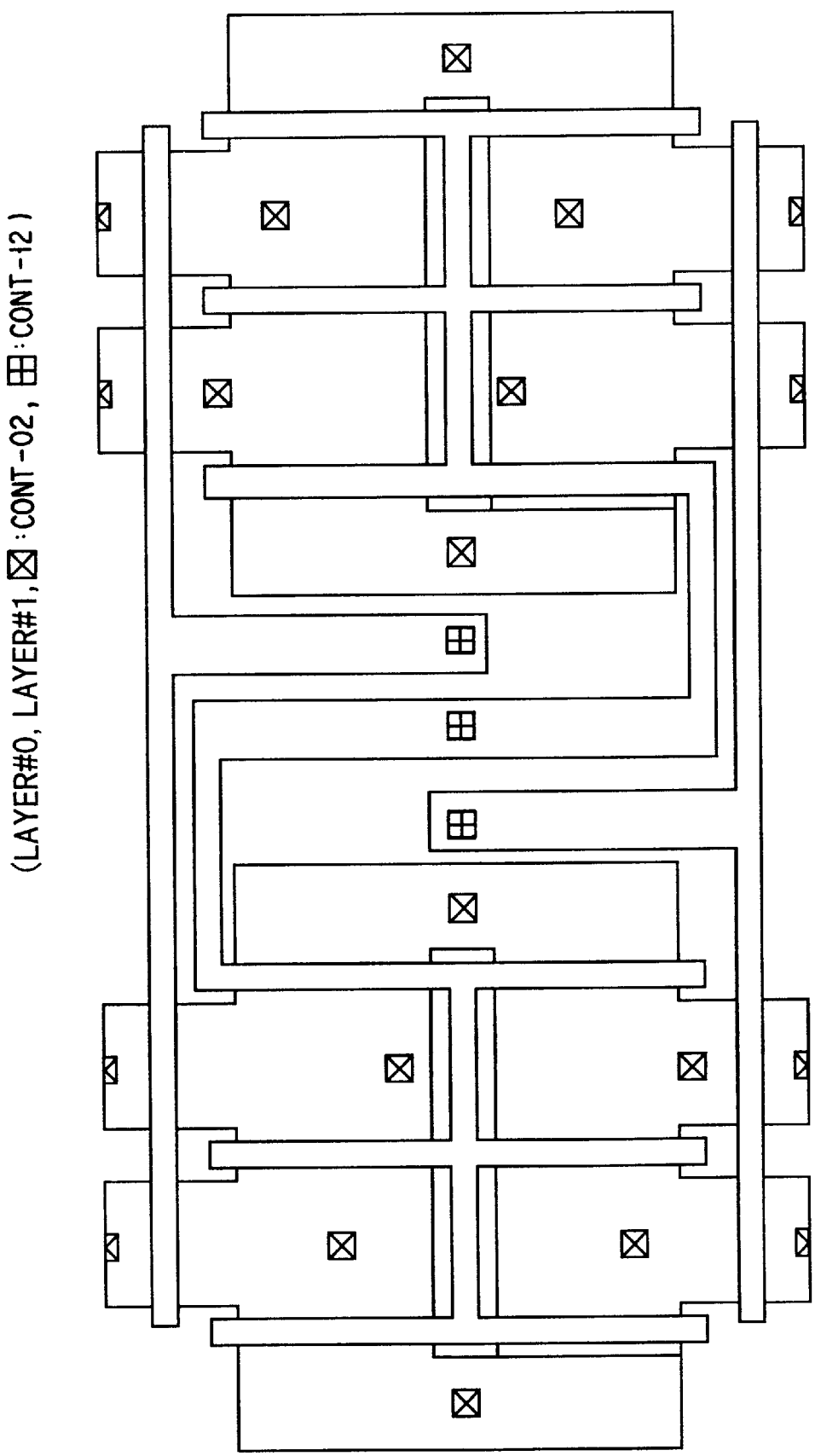
FIG. 33 is a view showing an element region, first wiring layer, and a contact for connecting the first wiring layer to a second wiring layer in the example of the sixth layout according to an embodiment of the present invention.
Figure 37:
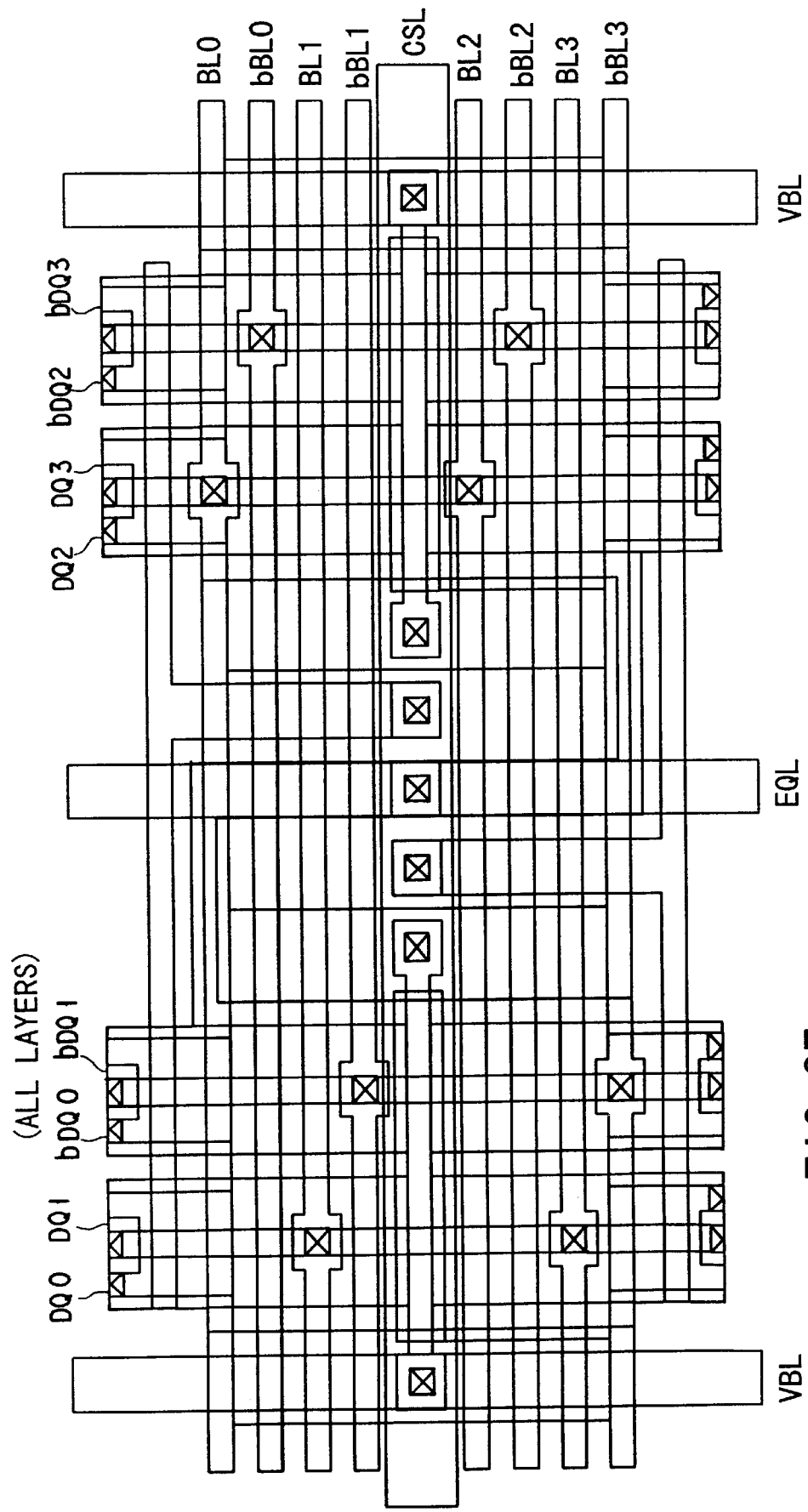
FIG. 37 is a view showing an example of a seventh layout pattern according to an embodiment of the preset invention.
Figure 38:
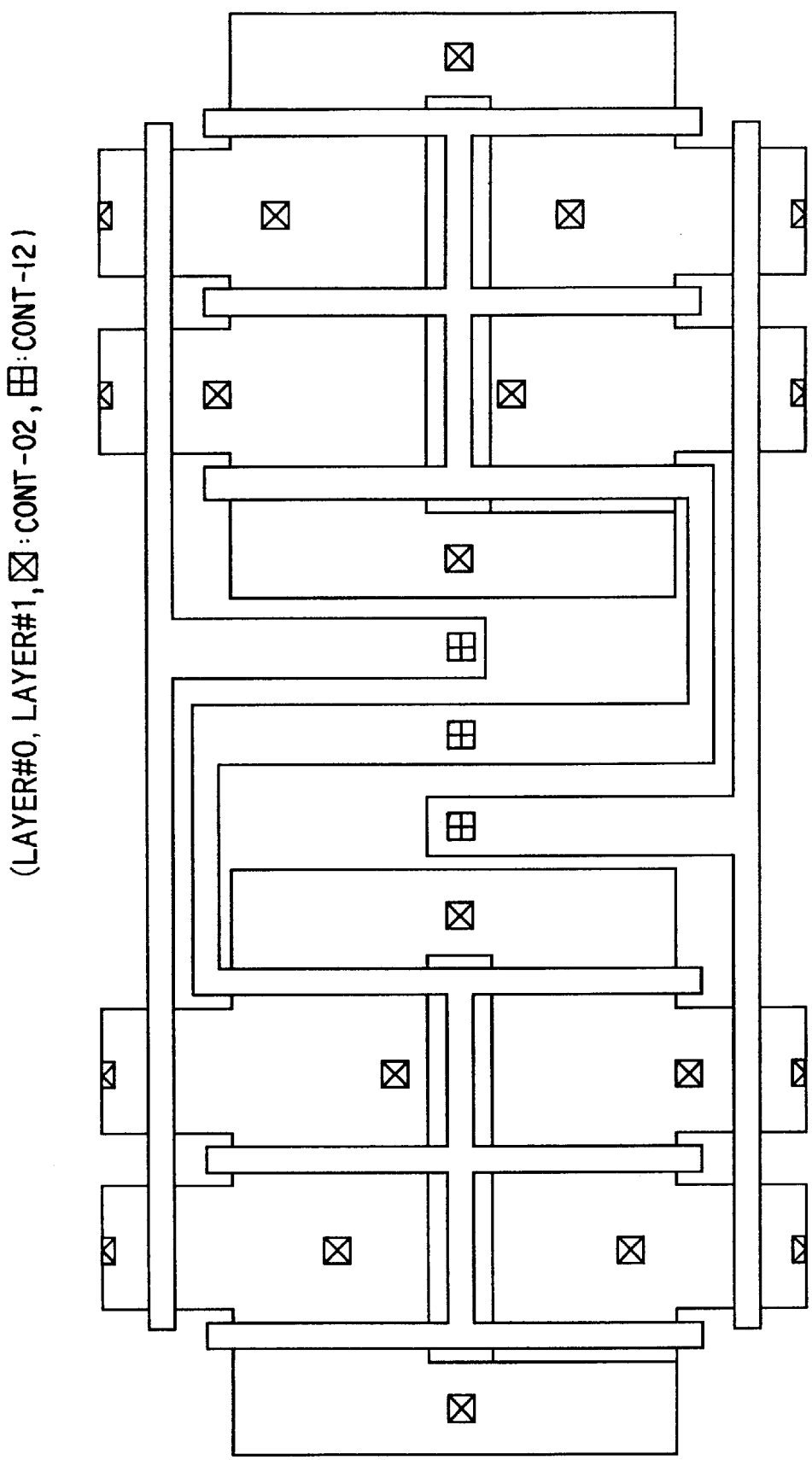
FIG. 38 is a view showing an element region, first wiring layer, and a contact for connecting the first wiring layer to a second wiring layer in the example of the seventh layout according to an embodiment of the present invention.
Figure 39:
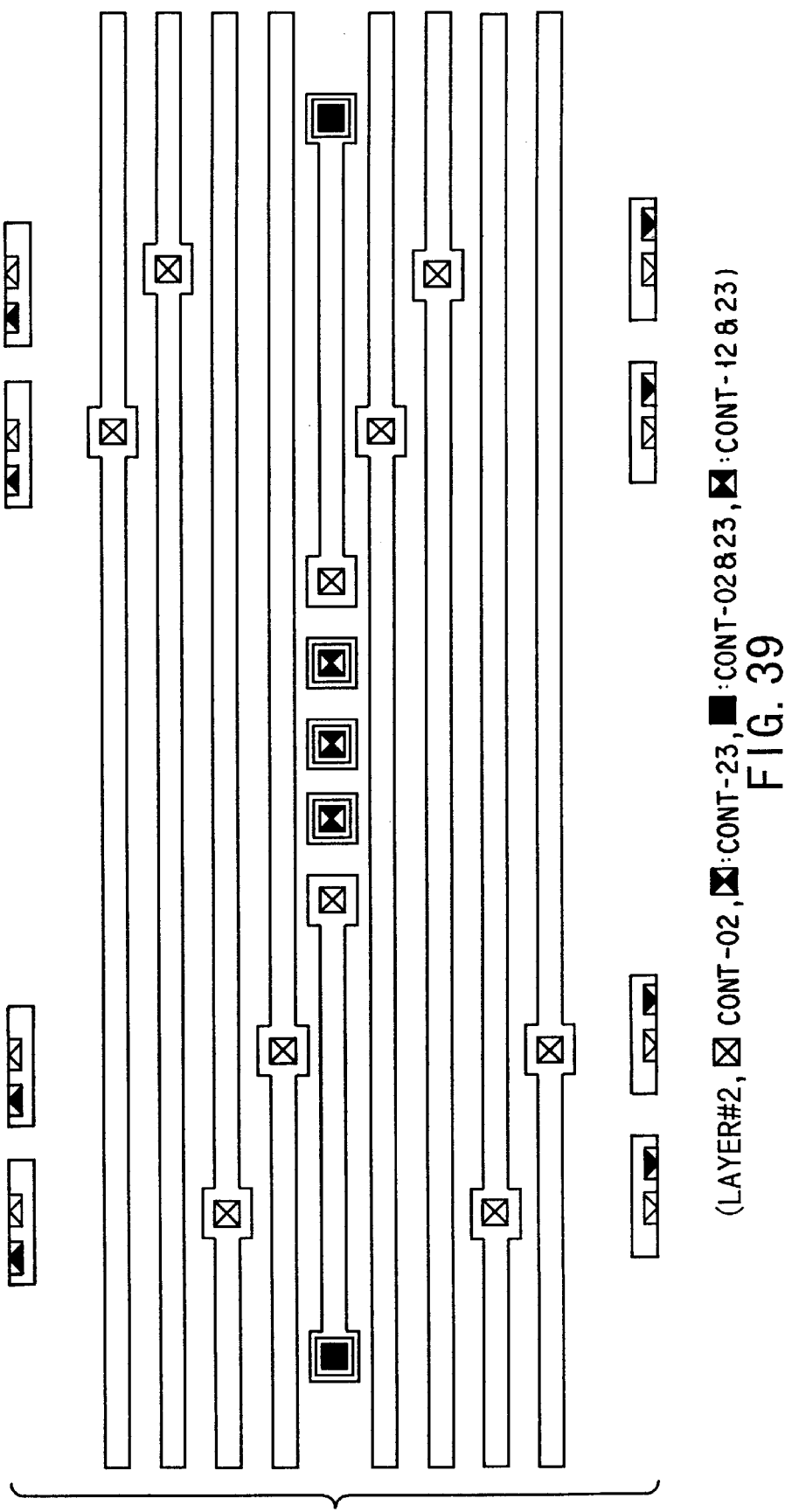
FIG. 39 is a view showing a second wiring layer, a contact for connecting the first wiring layer to the second wiring layer, and a contact for connecting the second wiring layer to a third wiring layer in the example of the seventh layout according to an embodiment of the present invention.
Figure 40:
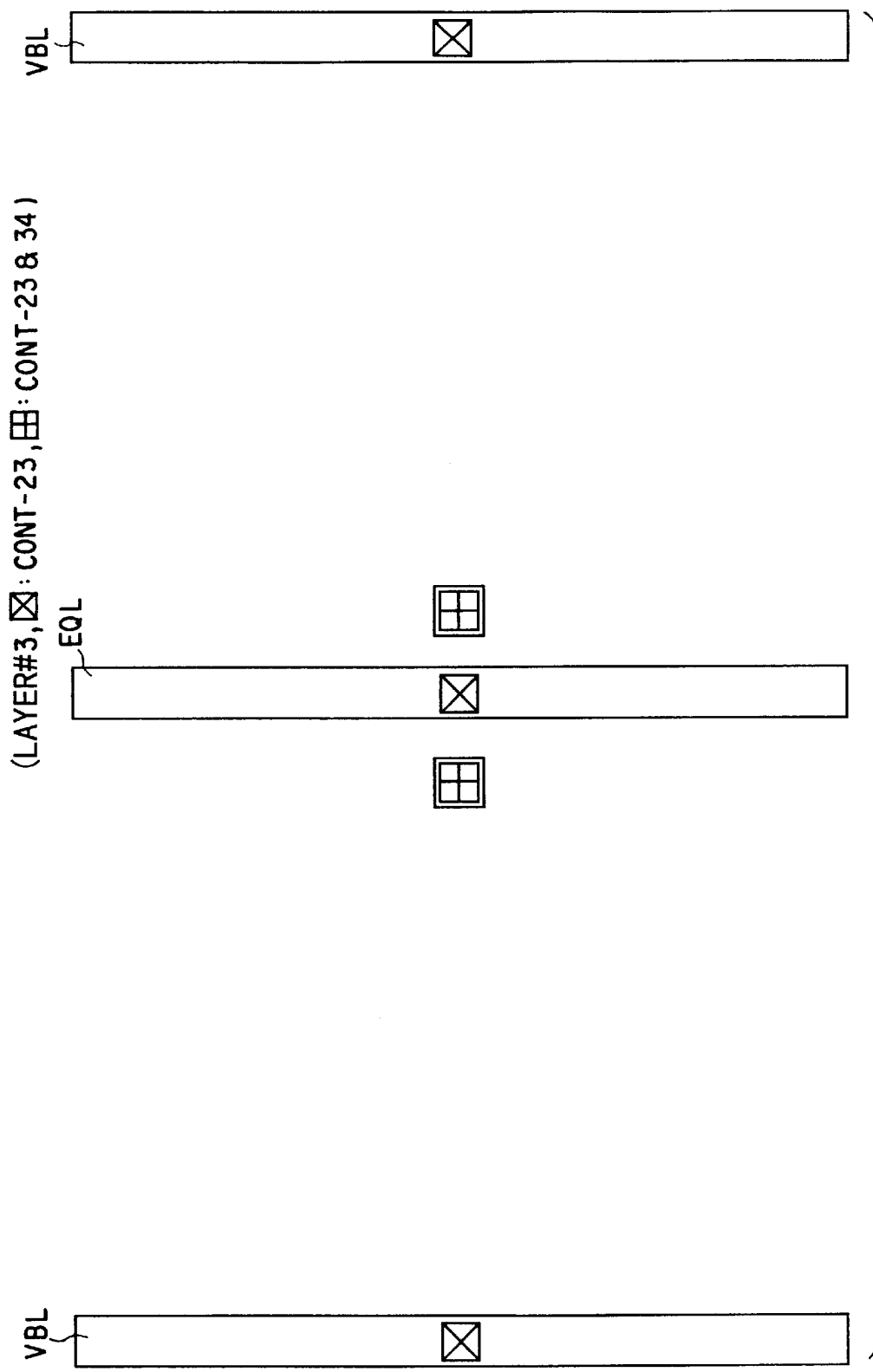
FIG. 40 is a view showing a third wiring layer, a contact for connecting the second wiring layer to the third wiring layer, and a contact for connecting the third wiring layer to a fourth wiring layer in the example of the seventh layout according to an embodiment of the present invention.
Figure 41:
FIG. 41 is a view showing a fourth wiring layer, a contact for connecting the third wiring layer to the fourth wiring layer, and a contact for connecting the fourth wiring layer to a fifth wiring layer in the example of the seventh layout according to an embodiment of the present invention.
Figure 42:
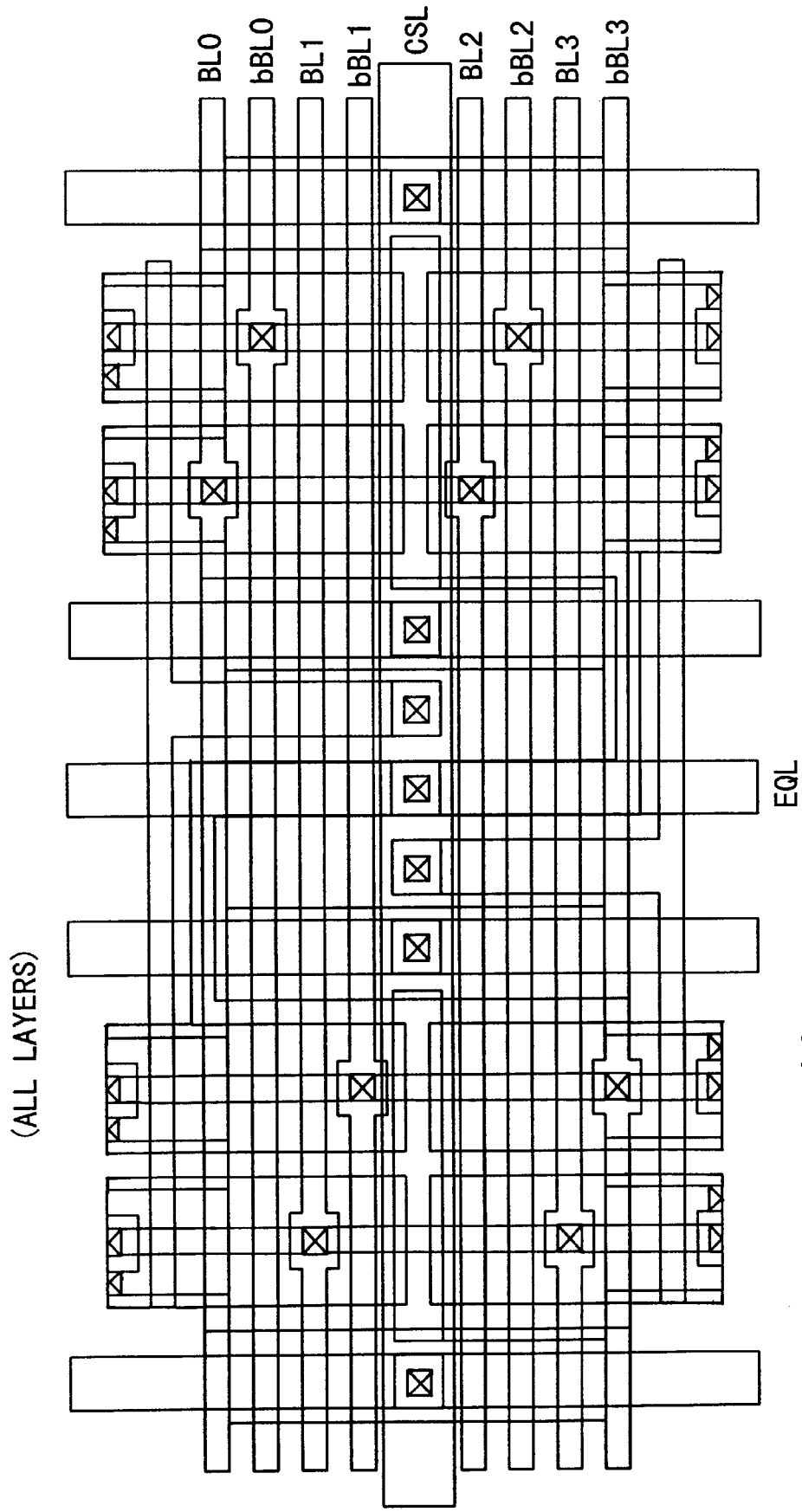
FIG. 42 is a view showing an example of a eighth layout pattern according to an embodiment of the preset invention.
Figure 43:
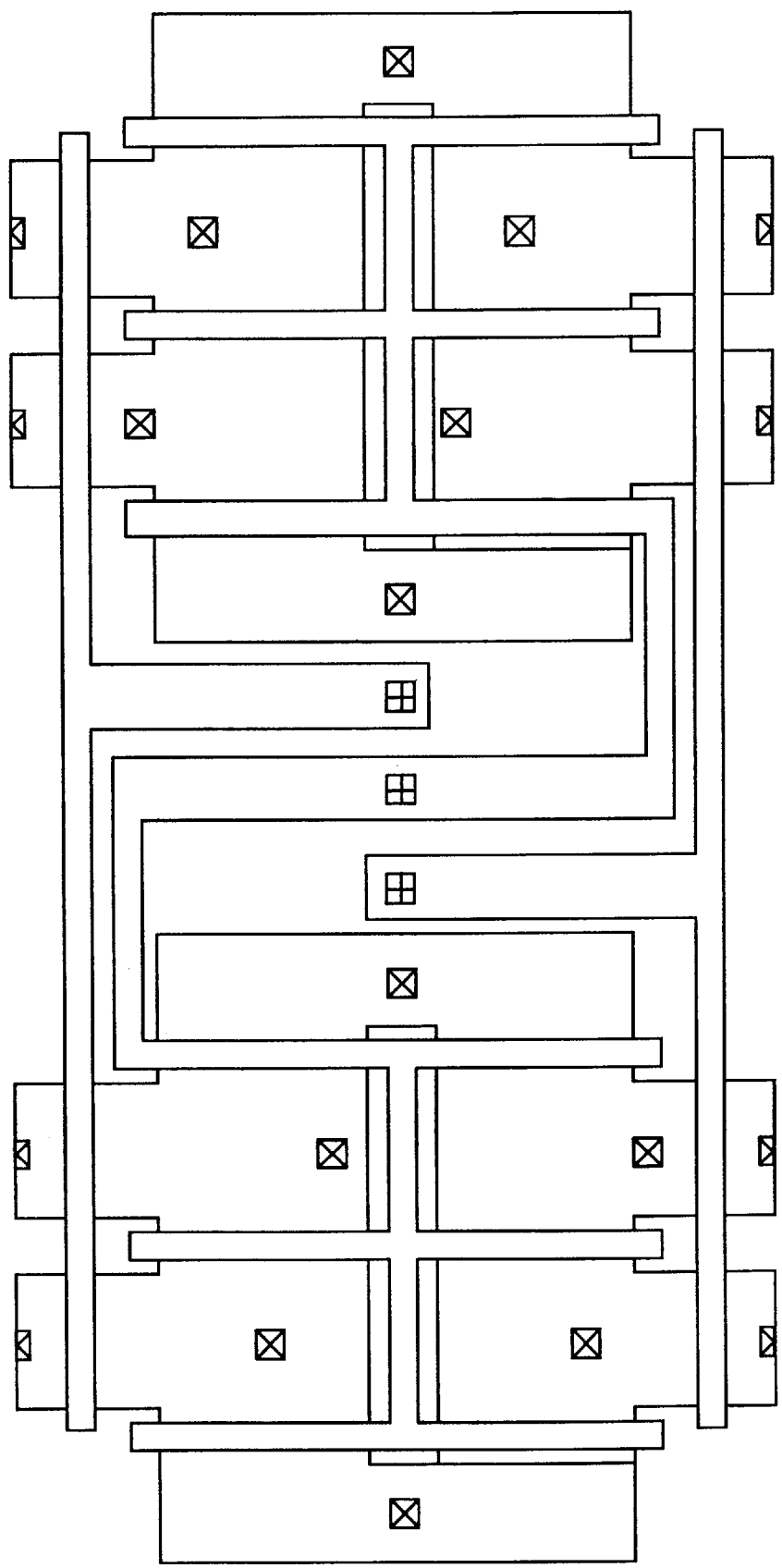
FIG. 43 is a view showing an element region, first wiring layer, and a contact for connecting the first wiring layer to a second wiring layer in the example of the eighth layout according to an embodiment of the present invention.
Figure 44:
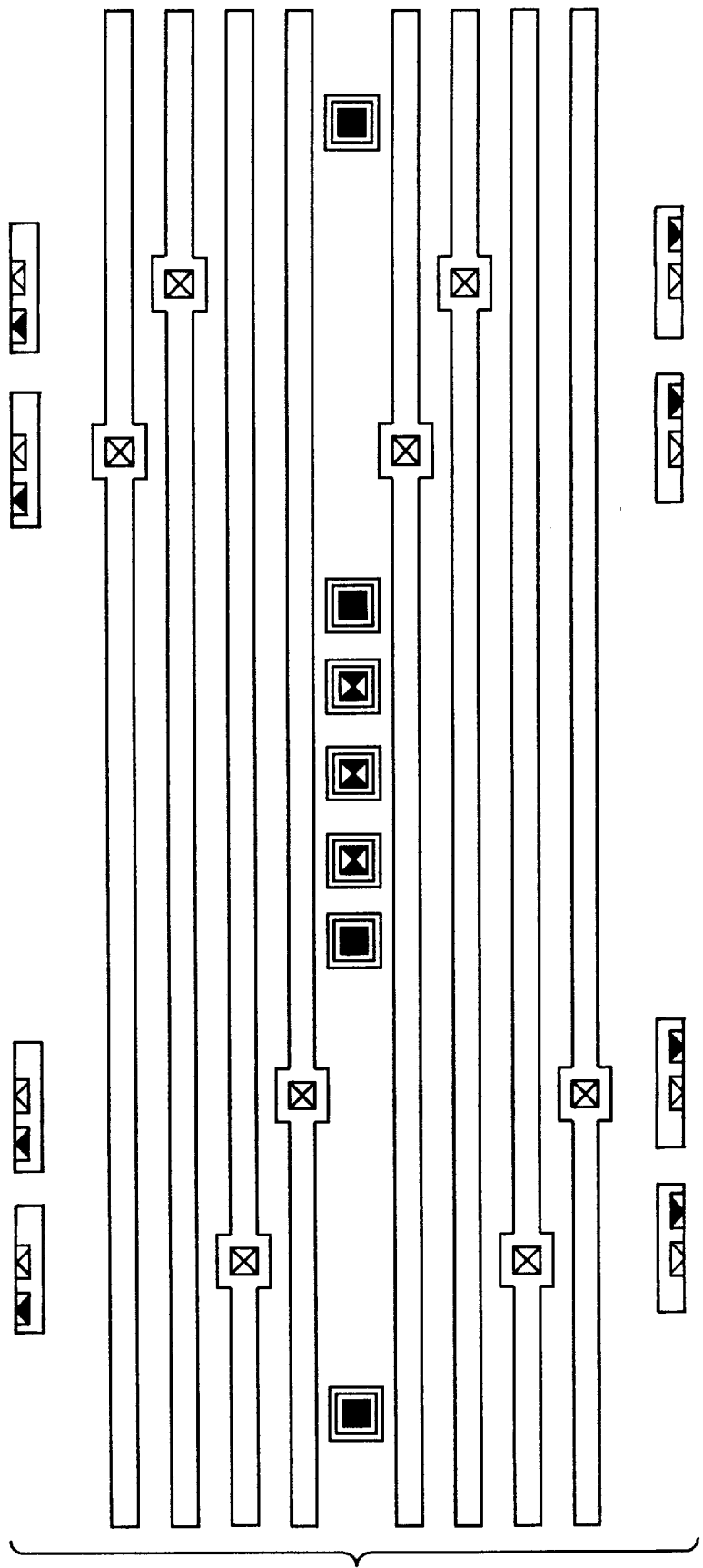
FIG. 44 is a view showing a second wiring layer, a contact for connecting the first wiring layer to the second wiring layer, and a contact for connecting the second wiring layer to a third wiring layer in the example of the eighth layout according to an embodiment of the present invention.

The example of the fifth layout pattern will be described in reference to FIGS. 27 to 31. FIG. 27 shows all the layers and all the contacts of a layout example, FIG. 28 shows layer#0, layer#1, cont-02, and cont-12, FIG. 29 shows layer#2, cont-02, cont-12 and cont-23, FIG. 30 shows layer#3, cont-23 and cont-34 and FIG. 31 shows layer#4 and cont-34.

In the example of the fourth layout pattern, wirings are formed by use of a wiring in an upper layer than a bitline on both sides of a column gate and a bitline equalizer and occupancy areas of the column gate and the bitline equalizer along a bitline direction are decreased.

An example of a sixth layout pattern is shown in FIGS. 32 to 36, an example of a seventh layout pattern is shown in FIGS. 37 to 41, and an example of an eighth layout pattern is shown in FIGS. 42 to 46, respectively.

In the example of the sixth layout pattern, two precharge voltage supply line VBL are prepared and disposed between adjacent patterns.

In the example of the seventh layout pattern, two precharge voltage supply line VBL are disposed outside of adjacent patterns.

In the example of the eighth layout pattern, four precharge voltage supply line VBL are prepared.

While the embodiment of the present invention has in detail described, the present invention is not limited to the embodiment but the embodiment can be modified or changed in various ways without departing from the spirit and the scope of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device, comprising:
    a semiconductor substrate;
    first and second bitlines parallelly laid in a first direction each of which performs data input/data output from/to a memory cell;
    a first diffusion layer connected with a bitline precharge potential supply line;
    a second diffusion layer connected with said first bitline;
    a third diffusion layer connected with said second bitline;
    a fourth diffusion layer connected with said bitline precharge potential supply line;
    a first gate electrode having first to third portions, wherein said first portion is provided above said semiconductor substrate and is provided adjacent to said first and second diffusion layers, said second portion is provided above said semiconductor substrate and is provided adjacent to said second and third diffusion layers, and said third portion is provided above said semiconductor substrate and is provided adjacent to said third and fourth diffusion layers;
    a fifth diffusion layer connected with a first data line;
    a sixth diffusion layer connected with a second data line;
    a second gate electrode having fourth and fifth portions, wherein said fourth portion is provided above said semiconductor substrate and is provided adjacent to said second and fifth diffusion layers, and said fifth portion is provided above said semiconductor substrate and is provided adjacent to said third and sixth diffusion layers.

2. The semiconductor memory device according to claim 1, wherein said first gate electrode connected with a bitline equalizer control line.

3. The semiconductor memory device according to claim 2, wherein said bitline equalizer control line is provided above said first gate electrode in a second direction.

4. The semiconductor memory device according to claim 1, wherein said second gate electrode connected with a column select line.

5. The semiconductor memory device according to claim 4, wherein said column select line is provided above said second gate electrode in a second direction.

6. The semiconductor memory device according to claim 1, wherein said first and second data lines are provided in a second direction.

7. The semiconductor memory device according to claim 1, wherein said bitline precharge potential supply line is provided in a second direction.

8. The semiconductor memory device according to claim 1, wherein said first to third portions of said first gate electrode are provided in a second direction normal to said first direction.

9. The semiconductor memory device according to claim 1, wherein said second gate electrode is provided in the first direction.

10. The semiconductor memory device according to claim 1, wherein said first to third portions of said first gate electrode are provided in a second direction normal to a direction to which said bitline is provided, and said second gate electrode is provided in the first direction.

11. The semiconductor memory device according to claim 1, wherein said first bitline is connected with said second diffusion layer through a first contact.

12. The semiconductor memory device according to claim 1, wherein said second bitline is connected with said third diffusion layer through a second contact.

13. The semiconductor memory device according to claim 1, wherein a width of said second direction of a first channel region sandwiched by said first and second diffusion layers under said first portion of said first gate electrode is substantially equal to a width of said second direction of a second channel region sandwiched by said second and third diffusion layers under said second portion of said first gate electrode.

14. A semiconductor memory device comprising:
    a semiconductor substrate;
    first to eighth bitlines parallelly laid in a first direction each of which performs data input and data output from and to a memory cell;
    first to eighth data lines parallelly laid in a second direction normal to the first direction;

a first element region formed in said semiconductor substrate, said first element region having first to tenth diffusion layers, said first and second diffusion layers connected with a bitline precharge potential supply line, said third to sixth diffusion layers connected with said first to fourth bitlines, respectively, said seventh to tenth diffusion layers connected with said first to fourth data lines, respectively;

a second element region formed in said semiconductor substrate, said second element region provided adjacent to said first element region and having eleventh to twenties diffusion layers, said eleventh and twelfth diffusion layers connected with said bitline precharge potential supply line, said thirteenth to sixteenth diffusion layers connected with said fifth to eighth bitlines, respectively, said seventeenth to twelfth diffusion layers connected with said fifth to eighth data lines, respectively;

a first gate formed above said first region and said second region, said first gate having first to twelfth portions, said first portion of said first gate provided adjacent to first and third diffusion layers, said second portion of said first gate provided adjacent to third and fourth diffusion layers, said third portion of said first gate provided adjacent to second and fourth diffusion layers, said fourth portion of said first gate provided adjacent to first and fifth diffusion layers, said fifth portion of said first gate provided adjacent to fifth and sixth diffusion layers, said sixth portion of said first gate provided adjacent to second and sixth diffusion layers, said seventh portion of said first gate provided adjacent to eleventh and thirteenth diffusion layers, said eighth portion of said first gate provided adjacent to thirteenth and fourteenth diffusion layers, said ninth portion of said first gate provided adjacent to twelfth and fourteenth diffusion layers, said tenth portion of said first gate provided adjacent to eleventh and fifteenth diffusion layers, said eleventh portion of said first gate provided adjacent to fifteenth and sixteenth diffusion layers, said twelfth portion of said first gate provided adjacent to twelfth and sixteenth diffusion layers;

a second gate formed above said first region and said second region, said second gate having first to fourth portions, said first portion of said second gate provided adjacent to third and seventh diffusion layers, said second portion of said second gate provided adjacent to fourth and eighth diffusion layers, said third portion of said second gate provided adjacent to thirteenth and seventeenth diffusion layers, said fourth portion of said second gate provided adjacent to tenth and seventeenth diffusion layers;

a third gate formed above said first region and said second region, said third gate having first to fourth portions, said first portion of said third gate provided adjacent to fifth and ninth diffusion layers, said second portion of said third gate provided adjacent to sixth and tenth diffusion layers, said third portion of said third gate provided adjacent to fifteenth and nineteenth diffusion layers, said fourth portion of said third gate provided adjacent to sixteenth and twelfth diffusion layers;

first to third contacts provided between said first and second element regions and connected with said first to third gates, respectively; and fourth and fifth contacts connected with second and twelfth diffusion layers, respectively, said first to fifth contacts arranged substantially in a line.

15. The semiconductor memory device according to claim 14, wherein said first gate electrode connected with a bitline equalizer control line.

16. The semiconductor memory device according to claim 15, wherein said bitline equalizer control line is provided above said first gate electrode in the second direction.

17. The semiconductor memory device according to claim 14, wherein said second and third gate electrodes connected with a column select line.

18. The semiconductor memory device according to claim 17, wherein said column select line is provided above said second and third gate electrodes in the second direction.

19. The semiconductor memory device according to claim 14, wherein said bitline precharge potential supply line is provided in the second direction.

20. The semiconductor memory device according to claim 14, wherein said first to twelfth portions of said first gate electrode are provided in the second direction.

21. The semiconductor memory device according to claim 14, wherein said second and third gate electrodes are provided in the first direction.

22. A semiconductor memory device comprising:

a semiconductor substrate;

first to eighth bitlines parallelly laid in a first direction each of which performs data input and data output from and to a memory cell;

first to eighth data lines parallelly laid in a second direction normal to the first direction;

a first element region formed in said semiconductor substrate, said first element region having first to tenth diffusion layers, said first and second diffusion layers connected with a bitline precharge potential supply line, said third and sixth diffusion layers connected with said first to fourth bitlines, respectively, said seventh to tenth diffusion layers connected with said first to fourth data lines, respectively;

a second element region formed in said semiconductor substrate, said second element region provided adjacent to said first element region and having eleventh to twenties diffusion layers, said eleventh and twelfth diffusion layers connected with said bitline precharge potential supply line, said thirteenth to sixteenth diffusion layers connected with said fifth to eighth bitlines, respectively, said seventeenth to twelfth diffusion layers connected with said fifth to eighth data lines, respectively;

a first gate formed above said first region and said second region, said first gate having first to twelfth portions, said first portion of said first gate provided adjacent to first and third diffusion layers, said second portion of said first gate provided adjacent to third and fourth diffusion layers, said third portion of said first gate provided adjacent to second and fourth diffusion layers, said fourth portion of said first gate provided adjacent to first and fifth diffusion layers, said fifth portion of said first gate provided adjacent to fifth and sixth diffusion layers, said sixth portion of said first gate provided adjacent to second and sixth diffusion layers, said seventh portion of said first gate provided adjacent to eleventh and thirteenth diffusion layers, said eighth portion of said first gate provided adjacent to thirteenth and fourteenth diffusion layers, said ninth portion of said first gate provided adjacent to twelfth and fourteenth diffusion layers, said tenth portion of said first gate provided adjacent to eleventh and fifteenth diffusion layers, said eleventh portion of said first gate provided adjacent to fifteenth and sixteenth diffusion layers, said twelfth portion of said first gate provided adjacent to twelfth and sixteenth diffusion layers;

a second gate formed above said first region and said second region, said second gate having first to fourth portions, said first portion of said second gate provided adjacent to third and seventh diffusion layers, said second portion of said second gate provided adjacent to fourth and eighth diffusion layers, said third portion of said third gate provided adjacent to fifth and ninth diffusion layers, said fourth portion of said third gate provided adjacent to sixth and tenth diffusion layers; and a third gate formed above said first region and said second region, said third gate having first to fourth portions, said first portion of said second gate provided adjacent to thirteenth and seventeenth diffusion layers, said second portion of said second gate provided adjacent to fourteenth and eighteenth diffusion layers, said third portion of said third data provided adjacent to fifteenth and nineteenth diffusion layers, said fourth portion of said third gate provided adjacent to sixteenth and twelfth diffusion layers, wherein said bitline precharge potential supply line provided substantially above said eleventh diffusion layer.

23. The semiconductor memory device according to claim 22, wherein said first gate electrode connected with a bitline equalizer control line.

24. The semiconductor memory device according to claim 23, wherein said bitline equalizer control line is provided above said first gate electrode in the second direction.

25. The semiconductor memory device according to claim 22, wherein said second and third gate electrodes connected with a column select line.

26. The semiconductor memory device according to claim 25, wherein said column select line is provided above said second and third gate electrodes in the second direction.

27. The semiconductor memory device according to claim 22, wherein said bitline precharge potential supply line is provided in the second direction.

28. The semiconductor memory device according to claim 22, wherein said first to twelfth portions of said first gate electrode are provided in the second direction.

29. The semiconductor memory device according to claim 22, wherein said second gate electrode is provided in a U-shape.

30. A semiconductor memory device comprising:

a semiconductor substrate;

first to eighth bitlines parallelly laid in a first direction each of which performs data input and data output from and to a memory cell;

first to eighth data lines parallelly laid in a second direction normal to the first direction;

a first element region formed in said semiconductor substrate, said first element region having first to tenth diffusion layers, said first and second diffusion layers connected with a bitline precharge potential supply line, said third to sixth diffusion layers connected with said first to fourth bitlines, respectively, said seventh to tenth diffusion layers connected with said first to fourth data lines, respectively;

a second element region formed in said semiconductor substrate, said second element region provided adjacent to said first element region and having eleventh to twenties diffusion layers, said eleventh and twelfth diffusion layers connected with said bitline precharge potential supply line, said thirteenth to sixteenth diffusion layers connected with said fifth to eighth bitlines, respectively, said seventeenth to twelfth diffusion layers connected with said fifth to eighth data lines, respectively;

a first gate formed above said first region and said second region, said first gate having first to twelfth portions, said first portion of said first gate provided adjacent to first and third diffusion layers, said second portion of said first gate provided adjacent to third and fourth diffusion layers, said third portion of said first gate provided adjacent to second and fourth diffusion layers, said fourth portion of said first gate provided adjacent to first and fifth diffusion layers, said fifth portion of said first gate provided adjacent to fifth and sixth diffusion layers, said sixth portion of said first gate provided adjacent to second and sixth diffusion layers, said seventh portion of said first gate provided adjacent to eleventh and thirteenth diffusion layers, said eighth portion of said first gate provided adjacent to thirteenth and fourteenth diffusion layers, said ninth portion of said first gate provided adjacent to twelfth and fourteenth diffusion layers, said tenth portion of said first gate provided adjacent to eleventh and fifteenth diffusion layers, said eleventh portion of said first gate provided adjacent to fifteenth and sixteenth diffusion layers, said twelfth portion of said first gate provided adjacent to twelfth and sixteenth diffusion layers;

a second gate forned above said first region and said second region, said second gate having first and second portions, said first portion of said second gate provided adjacent to third and seventh diffusion layers, said second portion of said second gate provided adjacent to fourth and eighth diffusion layers;

a third gate formed above said first region and said second region, said third gate having first and second portions, said first portion of said third gate provided adjacent to fifth and ninth diffusion layers, said second portion of said third gate provided adjacent to sixth and tenth diffusion layers;

a fourth gate formed above said first region and said second region, said second gate having first and second portions, said first portion of said fourth gate provided adjacent to thirteenth and seventeenth diffusion layers, said second portion of said fourth gate provided adjacent to fourteenth and eighteenth diffusion layers;

a fifth gate forned above said first region and said second region, said third gate having first and second portions, said first portion of said fifth gate provided adjacent to fifteenth and nineteenth diffusion layers, said second portion of said fifth gate provided adjacent to sixteenth and twelfth diffusion layers;

a first wiring formed above said first to eighth bitlines in the second direction and connected to said second and third gate electrodes; and a second wiring formed above said first to eighth bitlines in the second direction and connected to said fourth and fifth gate electrode, wherein said bitline precharge potential supply line provided substantially above said eleventh diffusion layer.

31. The semiconductor memory device according to claim 30, wherein said first gate electrode connected with a bitline equalizer control line.

32. The semiconductor memory device according to claim 31, wherein said bitline equalizer control line is provided above said first gate electrode in the second direction.

33. The semiconductor memory device according to claim 30, wherein said second to fifth gate electrodes connected with a column select line.

34. The semiconductor memory device according to claim 33, wherein said column select line is provided above said second to fifth gate electrodes in the second direction.

35. The semiconductor memory device according to claim 30, wherein said bitline precharge potential supply line is provided in the second direction.

36. The semiconductor memory device according to claim 30, wherein said first to twelfth portions of said first gate electrode are provided in the second direction.

37. The semiconductor memory device according to claim 30, wherein said second to fifth gate electrodes is provided in the first direction.

38. The semiconductor memory device according to claim 30, wherein said first to twelfth portions of said first gate electrodes are provided in the second direction normal to a direction to which said bitline is provided, and said second to fifth gate electrodes are provided in the first direction.

39. A semiconductor memory device comprising:

a semiconductor substrate;

first to eighth bitlines parallelly laid in a first direction each of which performs data input and data output from and to a memory cell;

first to eighth data lines parallelly laid in a second direction normal to the first direction;

an element region formed in said semiconductor substrate, said element region having first to nineteenth diffusion layers, said first, second and eleventh diffusion layers connected with a bitline precharge potential supply line, said third to sixth and twelfth to fifteenth diffusion layers connected with said first to eighth bitlines, respectively, said seventh to tenth and sixteenth to nineteenth diffusion layers connected with said first to fourth data lines, respectively;

a first gate formed above said first region and said second region, said first gate having first to sixth portions, said first portion of said first gate provided adjacent to first and third diffusion layers, said second portion of said first gate provided adjacent to third and fourth diffusion layers, said third portion of said first gate provided adjacent to second and fourth diffusion layers, said fourth portion of said first gate provided adjacent to first and fifth diffusion layers, said fifth portion of said first gate provided adjacent to fifth and sixth diffusion layers, said sixth portion of said first gate provided adjacent to second and sixth diffusion layers;

a second gate formed above said first region and said second region, said second gate having first to sixth portions, said seventh portion of said second gate provided adjacent to second and twelfth diffusion layers, said eighth portion of said second gate provided adjacent to twelfth and thirteenth diffusion layers, said ninth portion of said second gate provided adjacent to eleventh the thirteenth diffusion layers, said tenth portion of said second gate provided adjacent to second and fourteenth diffusion layers, said eleventh portion of said second gate provided adjacent to fourteenth and fifteenth diffusion layers, said twelfth portion of said second gate provided adjacent to eleventh and fifteenth diffusion layers;

a bitline equalizer control line provided above said first to eighth bitlines in the second direction and connected with said first and second gate;

a third gate formed above said first region and said second region, said second gate having first to fourth portions, said first portion of said second gate provided adjacent to third and seventh diffusion layers, said second portion of said second gate provided adjacent to fourth and eighth diffusion layers, said third portion of said third gate provided adjacent to fifth and ninth diffusion layers, said fourth portion of said third gate provided adjacent to sixth and tenth diffusion layers;

a fourth gate formed above said first region and said second region, said third gate having first to fourth portions, said first portion of said second gate provided adjacent to twelfth and sixteenth diffusion layers, said second portion of said second gate provided adjacent to thirteenth and nineteenth diffusion layers, said third portion of said third gate provided adjacent to fourteenth and eighteenth diffusion layers, said fourth portion of said third gate provided adjacent to fifteenth and eleventh diffusion layers.

40. The semiconductor memory device according to claim 39, wherein said first and second gate electrodes connected with a bitline equalizer control line.

41. The semiconductor memory device according to claim 40, wherein said bitline equalizer control line is provided above said first and second gate electrodes in the second direction.

42. The semiconductor memory device according to claim 39, wherein said third and fourth gate electrodes connected with a column select line.

43. The semiconductor memory device according to claim 42, wherein said column select line is provided above said third and fourth gate electrodes in the second direction.

44. The semiconductor memory device according to claim 39, wherein said bitline precharge potential supply line is provided in the second direction.

45. The semiconductor memory device according to claim 39, wherein said first to sixth portions of said first gate electrode and said first to sixth portions of said second gate electrode are provided in the second direction.

46. The semiconductor memory device according to claim 39, wherein said third and fourth gate electrodes are provided in the first direction.

47. The semiconductor memory device according to claim 39, wherein said first to sixth portions of said first gate electrode and said first to sixth portions of said second gate electrode are provided in the second direction normal to a direction to which said bitline is provided, and said second gate electrode is provided in the first direction.

48. A semiconductor memory device comprising:

a semiconductor substrate;

first to eighth bitlines parallelly laid in a first direction each of which performs data input and data output from and to a memory cell;

first to eighth data lines parallelly laid in a second direction normal to the first direction;

an element region formed in said semiconductor substrate, said element region having first to nineteenth diffusion layers, said first, second and eleventh diffusion layers connected with said bitline precharge potential supply line, said third and sixth and twelfth to fifteenth diffusion layers connected with said first to eighth bitlines, respectively, said seventh to tenth and sixteenth to nineteenth diffusion layers connected with said first to fourth data lines, respectively;

a first gate formed above said first region and said second region, said first gate having first to sixth portions, said first portion of said first gate provided adjacent to first and third diffusion layers, said second portion of said first gate provided adjacent to third and fourth diffusion layers, said third portion of said first gate provided adjacent to second and fourth diffusion layers, said fourth portion of said first gate provided adjacent to first and fifth diffusion layers, said fifth portion of said first gate provided adjacent to fifth and sixth diffusion layers, said sixth portion of said first gate provided adjacent to second and sixth diffusion layers;

a second gate formed above said first region and said second region, said second gate having first to sixth portions, said seventh portion of said second gate provided adjacent to second and twelfth diffusion layers, said eighth portion of said second gate provided adjacent to twelfth and thirteenth diffusion layers, said ninth portion of said second gate provided adjacent to eleventh and thirteenth diffusion layers, said tenth portion of said second gate provided adjacent to second and fourteenth diffusion layers, said eleventh portion of said second gate provided adjacent to fourteenth and fifteenth diffusion layers, said twelfth portion of said second gate provided adjacent to eleventh and fifteenth diffusion layers;

a bitline equalizer control line provided above said first to eighth bitlines in the second direction and connected with said first and second gate;

a third gate formed above said first region and said second region, said second gate having first and second portions, said first portion of said second gate provided adjacent to third and seventh diffusion layers, said second portion of said second gate provided adjacent to fourth and eighth diffusion layers;

a fourth gate formed above said first region and said second region, said third gate having first and second portions, said first portion of said third gate provided adjacent to fifth and ninth diffusion layers, said second portion of said third gate provided adjacent to sixth and tenth diffusion layers;

a fifth gate formed above said first region and said second region, said second gate having first and second portions, said first portion of said fifth gate provided adjacent to twelfth and sixteenth diffusion layers, said second portion of said fifth gate provided adjacent to thirteenth and seventeenth diffusion layers;

a sixth gate formed above said first region and said second region, said third gate having first and second portions, said first portion of said sixth gate provided adjacent to fourteenth and eighteenth diffusion layers, said second portion of said sixth gate provided adjacent to fifteenth and nineteenth diffusion layers;

a first wiring formed above said first to eighth bitlines in the second direction and connected to said third and fourth gate electrodes; and a second wiring formed above said first to eighth bitlines in the second direction and connected to said fifth and sixth gate electrode.

49. The semiconductor memory device according to claim 48, wherein said first and second gate electrodes connected with a bitline equalizer control line.

50. The semiconductor memory device according to claim 49, wherein said bitline equalizer control line is provided above said first and second gate electrodes in the second direction.

51. The semiconductor memory device according to claim 48, wherein said third to sixth gate electrodes connected with a column select line.

52. The semiconductor memory device according to claim 51, wherein said column select line is provided above said third to sixth gate electrodes in the second direction.

53. The semiconductor memory device according to claim 48, wherein said bitline precharge potential supply line is provided in the second direction.

54. The semiconductor memory device according to claim 48, wherein said first to sixth portions of said first gate electrode and said first to sixth portions of said second gate electrode are provided in the second direction.

55. The semiconductor memory device according to claim 48, wherein said third to sixth gate electrodes are provided in the first direction.

56. The semiconductor memory device according to claim 48, wherein said first to sixth portions of said first gate electrode and said first to sixth portions of said second gate electrode are provided in the second direction normal to a direction to which said bitline is provided, and said third to sixth gate electrodes are provided in the first direction.

57. A semiconductor memory device comprising:

a semiconductor substrate;

first to eighth bitlines parallelly laid in a first direction each of which performs data input and data output from and to a memory cell;

first to eighth data lines parallelly laid in a second direction normal to the first direction;

a first element region formed in said semiconductor substrate, said first element region having first to tenth diffusion layers, said first and second diffusion layers connected with a first bitline precharge potential supply line, said third to sixth diffusion layers connected with said first to fourth bitlines, respectively, said seventh to tenth diffusion layers connected with said first to fourth data lines, respectively;

a second element region formed in said semiconductor substrate, said second element region provided adjacent to said first element region and having eleventh to twenties diffusion layers, said eleventh and twelfth diffusion layers connected with a second bitline precharge potential supply line, said thirteenth to sixteenth diffusion layers connected with said fifth to eighth bitlines, respectively, said seventeenth to twelfth diffusion layers connected with said fifth to eighth data lines, respectively;

a first gate formed above said first region and said second region, said first gate having first to twelfth portions, said first portion of said first gate provided adjacent to first and third diffusion layers, said second portion of said first gate provided adjacent to third and fourth diffusion layers, said third portion of said first gate provided adjacent to second and fourth diffusion layers, said fourth portion of said first gate provided adjacent to first and fifth diffusion layers, said fifth portion of said first gate provided adjacent to fifth and sixth diffusion layers, said sixth portion of said first gate provided adjacent to second and sixth diffusion layers, said seventh portion of said first gate provided adjacent to eleventh and thirteenth diffusion layers, said eighth portion of said first gate provided adjacent to thirteenth and fourteenth diffusion layers, said ninth portion of said first gate provided adjacent to twelfth and fourteenth diffusion layers, said tenth portion of said first gate provided adjacent to eleventh and fifteenth diffusion layers, said eleventh portion of said first gate provided adjacent to fifteenth and sixteenth diffusion layers, said twelfth portion of said first gate provided adjacent to twelfth and sixteenth diffusion layers;

a second gate forned above said first region and said second region, said second gate having first to fourth portions, said first portion of said second gate provided adjacent to third and seventh diffusion layers, said second portion of said second gate provided adjacent to fourth and eighth diffusion layers, said third portion of said second gate provided adjacent to thirteenth and seventeenth diffusion layers, said fourth portion of said second gate provided adjacent to thirteenth and seventeenth diffusion layers;

a third gate formed above said first region and said second region, said third gate having first to fourth portions, said first portion of said third gate provided adjacent to fifth and ninth diffusion layers, said second portion of said third gate provided adjacent to sixth and tenth diffusion layers, said third portion of said third gate provided adjacent to fifteenth and nineteenth diffusion layers, said fourth portion of said third gate provided adjacent to sixteenth and twelfth diffusion layers;

first to third contacts connected with said first to third gates, respectively; and fourth and fifth contacts connected with second and twelfth diffusion layers, respectively, said first to fifth contacts arranged substantially in a line.

58. The semiconductor memory device according to claim 57, wherein said first bitline precharge potential supply line is provided substantially above said second diffusion layer and said second bitline precharge potential supply line is provided substantially above said eleventh diffusion layer.

59. The semiconductor memory device according to claim 57, wherein said first bitline precharge potential supply line is provided substantially above said first diffusion layer and said second bitline precharge potential supply line is provided substantially above said twelfth diffusion layer.

60. The semiconductor memory device according to claim 57, wherein said first gate electrode connected with a bitline equalizer control line.

61. The semiconductor memory device according to claim 60, wherein said bitline equalizer control line is provided above said first gate electrode in the second direction.

62. The semiconductor memory device according to claim 57, wherein said second gate electrode connected with a column select line.

63. The semiconductor memory device according to claim 62, wherein said column select line is provided above said second gate electrode in the second direction.

64. The semiconductor memory device according to claim 57, wherein said bitline precharge potential supply line is provided in the second direction.

65. The semiconductor memory device according to claim 57, wherein said first to twelfth portions of said first gate electrode are provided in the second direction.

66. The semiconductor memory device according to claim 57, wherein said second and third gate electrodes are provided in the first direction.

67. The semiconductor memory device according to claim 57, wherein said first to third portions of said first gate electrode are provided in the second direction normal to a direction to which said bitline is provided, and said second and third gate electrodes are provided in the first direction.

68. A semiconductor memory device comprising:

a semiconductor substrate;

an element region formed in said semiconductor substrate;

first and second data lines parallelly laid in a first direction each of which performs data input/data output from/to a memory cell;

a first diffusion layer formed in said element region, said first diffusion layer being connected with a predetermined potential supply line;

a second diffusion layer formed in said element region, said second diffusion layer being connected with said predetermined potential supply line;

a third diffusion layer formed in said element region, said third diffusion layer being connected with said first data line;

a fourth diffusion layer formed in said element region, said fourth diffusion layer being connected with said second data line;

a fifth diffusion layer formed in said element region, said fifth diffusion layer being connected with a third data line;

a sixth diffusion layer formed in said element region, said sixth diffusion layer being connected with a fourth data line;

a first gate electrode having first to third portions, wherein said first portion is provided above said semiconductor substrate and is provided adjacent said first and third diffusion layers, said second portion is provided above said semiconductor substrate and is provided adjacent said second and fourth diffusion layers, and said third portion is provided above said semiconductor substrate and is provided adjacent said third and fourth diffusion layers;

a second gate electrode having fourth and fifth portions, wherein said fourth portion is provided above said semiconductor substrate and is provided adjacent said third and fourth diffusion layers, said fifth portion is provided above said semiconductor substrate and is provided adjacent said fourth and sixth diffusion layers.

69. The semiconductor memory device according to claim 68, wherein said first gate electrode connected with a data line equalizer control line.

70. The semiconductor memory device according to claim 69, wherein said data line equalizer control line is provided above said first gate electrode in a second direction normal to said first direction.

71. The semiconductor memory device according to claim 70, wherein said second gate electrode connected with a data select line.

72. The semiconductor memory device according to claim 71, wherein said data select line is provided above said second gate electrode in said second direction.

73. The semiconductor memory device according to claim 72, wherein said data line precharge potential supply line is provided in said second direction.

74. The semiconductor memory device according to claim 73, wherein said second gate electrode is provided in the first direction.

75. The semiconductor memory device according to claim 74, wherein said first data line is connected with said third diffusion layer through a first contact.

76. The semiconductor memory device according to claim 75, wherein said second data line is connected with said fourth diffusion layer through a second contact.

77. The semiconductor memory device according to claim 76, wherein a width of said second direction of a first channel region sandwiched by said first and third diffusion layers under said first portion of said first gate electrode is substantially equal to a width of said second direction of a second channel region sandwiched by said second and fourth diffusion layers under said second portion of said first gate electrode.

* * * * *

UNITED STATES PATENT AND TRADEMARK OFFICE
CERTIFICATE OF CORRECTION

PATENT NO.    : 6,288,927 B1
DATED         : September 11, 2001
INVENTOR(S)   : Tsuneo Inaba et al.

It is certified that error appears in the above-identified patent and that said Letters Patent is hereby corrected as shown below:

<u>Title page,</u>
Item [75], Inventors, "Kouji Tsuchida" has been replaced with -- Kenji Tsuchida --,
Item [56], References Cited, U.S. PATENT DOCUMENTS, "Watamabe" has been replaced with -- Watanabe --.

<u>Column 13,</u>
Line 50, "sevententh" has been replaced with -- seventeenth --,
Line 51, "tenth and sevententh" has been replaced with -- thirteenth and seventeenth --.

<u>Column 16,</u>
Lines 29 and 48, "forned" has been replaced with -- formed --.

<u>Column 20,</u>
Line 66, "forned" has been replaced with -- formed --.

Signed and Sealed this

Twenty-third Day of July, 2002

Attest:

JAMES E. ROGAN
*Attesting Officer*                *Director of the United States Patent and Trademark Office*